United States Patent [19]

Curtis et al.

[11] Patent Number: 5,784,797
[45] Date of Patent: Jul. 28, 1998

[54] CARRIERLESS CENTRIFUGAL SEMICONDUCTOR PROCESSING SYSTEM

[75] Inventors: Gary L. Curtis; Raymon F. Thompson; Robert W. Berner; Ed Fix, all of Kalispell, Mont.

[73] Assignee: Semitool, Inc., Kalispell, Mont.

[21] Appl. No.: 622,349

[22] Filed: Mar. 26, 1996

Related U.S. Application Data

[63] Continuation-in-part of Ser. No. 236,424, Apr. 28, 1994, Pat. No. 5,544,421, Ser. No. 415,927, Mar. 31, 1995, Pat. No. 5,660,517, and Ser. No. 415,240, Apr. 3, 1995, Pat. No. 5,678,320.

[51] Int. Cl.$^6$ .................................................. F26B 17/24
[52] U.S. Cl. ........................ 34/58; 34/317; 34/312; 134/95.2
[58] Field of Search ........................ 34/58, 312, 328, 34/317; 134/95.2, 95.3; 414/217, 222

[56] References Cited

U.S. PATENT DOCUMENTS

| | | | |
|---|---|---|---|
| 3,968,885 | 7/1976 | Hassan et al. | 414/591 |
| 4,300,581 | 11/1981 | Thompson | 134/57 R |
| 4,313,266 | 2/1982 | Tam | 34/317 |
| 4,431,361 | 2/1984 | Bayne | 414/405 |
| 4,449,885 | 5/1984 | Hertel et al. | 414/750 |
| 4,571,850 | 2/1986 | Hunt et al. | 34/242 |
| 4,651,440 | 3/1987 | Karl | 34/58 |
| 4,693,017 | 9/1987 | Oehler et al. | 34/58 |
| 4,840,530 | 6/1989 | Nguyen | |
| 4,907,349 | 3/1990 | Aigo | 34/58 |
| 4,962,726 | 10/1990 | Matsushita et al. | 118/719 |
| 5,026,239 | 6/1991 | Chiba et al. | 414/217 |
| 5,055,036 | 10/1991 | Asano et al. | 432/5 |
| 5,125,784 | 6/1992 | Asano | 414/404 |
| 5,174,045 | 12/1992 | Thompson et al. | 34/58 |
| 5,224,503 | 7/1993 | Thompson et al. | 134/95.2 |
| 5,232,328 | 8/1993 | Owczarz et al. | 414/222 |
| 5,301,700 | 4/1994 | Kamikawa et al. | 134/76 |
| 5,562,113 | 10/1996 | Thompson et al. | 134/95.2 |

FOREIGN PATENT DOCUMENTS

| | | |
|---|---|---|
| 0047132 | 3/1982 | European Pat. Off. |
| 0292090 | 11/1988 | European Pat. Off. |
| PCT/US81/00257 | 9/1981 | WIPO |
| PCT/US91/02847 | 9/1992 | WIPO |

*Primary Examiner*—Henry A. Bennett
*Assistant Examiner*—Pamela A. Wilson
*Attorney, Agent, or Firm*—Wells, St. John, Roberts, Gregory & Matkin, P.S.

[57] ABSTRACT

A centrifugal semiconductor processing system having a rotor which holds articles for centrifugal processing. The rotor includes a rotor frame with a receiver for holding the wafers or other articles in a spaced array without a wafer carrier to improve fluid access to the wafers. The rotor also has one or more retainers which are pivoted relative to the rotor to controllably urge the wafers into their desired processing positions. The retainers are preferably constructed to provide initial spring biasing with added restraining forces being generated during rotation. The processing system also preferably includes an implement mounted on a robot for loading the rotor, and a vision system to aid in the loading operation.

64 Claims, 11 Drawing Sheets

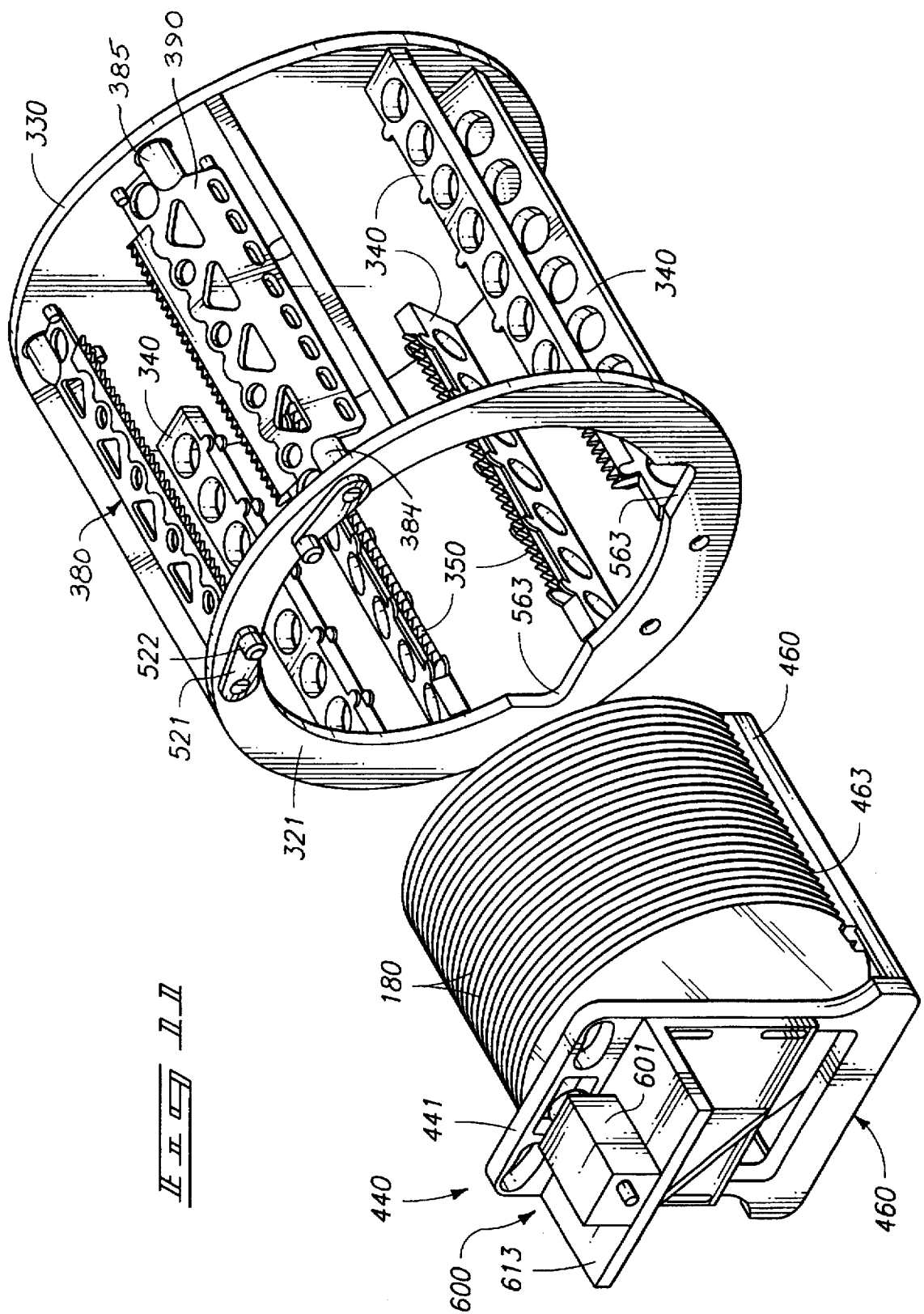

CARRIERLESS CENTRIFUGAL SEMICONDUCTOR PROCESSING SYSTEM

CROSS-REFERENCES TO RELATED CASES

This is a continuation-in-part of prior U.S. patent application Ser. No. 08/236,424 filed Apr. 28, 1994 now U.S. Pat. No. 5,544,421; Ser. No. 08/415,927 filed Mar. 31, 1995 now U.S. Pat. No. 5,660,517; Ser. No. 08/415,240 filed Apr. 3, 1995 now U.S. Pat. No. 5,678,320. Priority under 35 USC § 120 is claimed with respect to such prior applications.

TECHNICAL FIELD OF THE INVENTION

The present invention relates generally to centrifugal processing systems with rotors adapted to hold wafers or other semiconductor articles without carriers, and associated transfer implements for facilitating the transfer of semiconductor wafers to and from the rotor.

BACKGROUND OF THE INVENTION

During the fabrication of semiconductor components, various manufacturing steps involve the application of processing liquids and gases to the articles being processed. The application and removal of these processing fluids to and from the exposed surfaces of the wafers are enhanced by movement of the wafers within the processing chamber. Processing is also enhanced by centrifugal action of the semiconductor wafers which improves movement of fluids across the wafer surfaces, such as when liquids are sprayed upon the wafer and then move across the wafer surfaces due to centrifugal forces acting upon the liquids as the wafers spin.

As one example, after semiconductor wafers have been cleaned, they must be dried. This is not a trivial process because any water that remains on the surface of a semiconductor wafer has at least some potential of leaving some form of residue which may interfere with subsequent operations or cause defects in the resulting products. Centrifugal action aids in the removal of water and other processing liquids so that such residues are not as likely to occur because the fluid is applied to the surface and then moves outwardly and is removed from the surfaces. Drying is also benefitted because less liquid remains on the wafer surfaces, so drying speed is increased. This saves processing time and reduces the risk of residue or contamination due to particle adhesion.

In one type of prior art centrifugal processor, several wafer carriers are put in holders or carriers in a spaced substantially circular array around the axis of rotation. The rotor with loaded carriers of wafers is then rotated within a processing chamber which is typically enclosed within a processing bowl or vessel. In the center of the vessel and at other peripheral locations are fluid manifolds with spray nozzles or similar inlets that are connected to a source of deionized water, heated nitrogen, or other processing chemicals both liquids and gases. These or other processing fluids are thus applied to the wafers to effect washing, drying or other processing.

Other prior art spin rinser dryers have been built for drying batches of wafers held in a single wafer carrier. The wafer carrier and supported wafers are held within a rotor. The rotor has an opening for receiving the carrier with the wafers positioned in an array with the centerpoints of the wafers at or nearly aligned with the axis of rotation. Typically a small offset is used so that the wafers will seat into the wafer carriers as centrifugal forces are developed during rotation. The water, nitrogen or other processing fluids come into the chamber along the sides rather than through a manifold mounted at the center. The rinsing, other liquids application, or drying take place as the rotor spins with the carrier and wafers held therein. Stationary retainer bars are typically provided adjacent the open top side of the wafer carrier to prevent the wafers from being displaced if the rotor should stop in an upside-down position. The rotors are also typically controlled to stop in a right-side-up position. This type of spin rinser dryer is normally termed an axial or on-axis spin rinser dryer.

Additionally semiconductor processing machines of similar configuration are also used for centrifugal chemical etching or other chemical processing. In this regard, the required chemicals are pressurized or pumped to the processing chamber and valves control the supply of such chemicals into the chamber. The chemical processing can be following by associated rinsing and drying operations. The application of processing chemicals adds to the complexity of the processing because highly reactive chemicals may impinge upon the wafer surfaces at different angles, fluid velocities, with differing flow rates, and with other dynamically varying effects. This variability can cause different etch rates or other variations in chemical processing which is difficult to overcome.

Process uniformity within a batch and repeatability from batch to batch have been major considerations in semiconductor processing, and in particular centrifugal semiconductor processing. The issue is particularly of interest in the case of batch centrifugal processing because the wafers are held in closely spaced arrays using wafer carriers. In addition to inherent variations in the application of processing fluids to the wafers, there are also variations associated with how wafers are held within the carriers. The structural parts of the carriers necessarily restrict access of fluids to the wafer surfaces. This has almost invariably led to different processing results for wafers in different positions within a carrier, even though processing has occurred in the same batch. Although carriers have been designed to reduce their effects on processing fluid distribution within the processing chamber, it has been impossible to eliminate their effects on uniformity and repeatability of processing results.

While the apparatus and methods utilized heretofore have operated with varying degrees of success, they have also sometimes suffered problems with regard to contamination or particle additions which can occur during processing. As the features and geometries of the discrete components formed on the semiconductor devices have become smaller and more densely packed, the need for more stringent contamination control has become increasingly difficult.

Thus there has been a need in the art of semiconductor wafer and similar article processing for a centrifugal processing machine which provides improved uniformity of process results while minimizing the possibility of contamination. This must be done without substantial risk of damage to the semiconductor wafers.

SUMMARY EXPLANATION OF FEATURES

The invention can be embodied in various forms and constructions some of which are summarily outlined below.

In one aspect the invention includes a centrifugal process rotor for holding a plurality of semiconductor articles for centrifugal treatment, comprising:

a rotor frame mounted for rotation;

a receiver on the rotor frame for receiving the plurality of semiconductor articles;

at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position.

In other aspects the centrifugal process rotor is advantageously embodied in the combination indicated above with less than the stated features, or one or more added features which can advantageously be selected alone or in combination to include the following:

at least one movable article retainer is pivotally connected to the rotor frame and balanced to force the semiconductor articles into the desired processing positions when the rotor is rotated and centrifugal forces are developed thereon;

said at least one movable article retainer further being spring biased when in a closed position to initially bear upon the semiconductor articles without rotation of the rotor;

at least one retainer operator which operates at least one movable article retainer in movable relationship to the rotor frame to effect automatic operation of the at least one movable article retainer to develop force against semiconductor articles held in the receiver during rotation of the rotor;

wherein said at least one movable article retainer is spring biased into an open position, or wherein said at least one movable article retainer is spring biased into open and closed positions;

a wherein there are a plurality of movable article retainers.

In another aspect the invention includes a rotor and rotor transfer implement combination for loading, unloading and centrifugally processing a plurality of semiconductor articles, comprising:

a rotor having:
a rotor frame mounted for rotation;
a receiver on the rotor frame for receiving the plurality of semiconductor articles;
at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position;

a transfer implement having:
plural semiconductor holding features for holding the plurality of semiconductor articles in suitable transfer positions for being received within the receiver.

In still further aspects the rotor and rotor transfer implement combination is advantageously embodied in the combination indicated above with less than the stated features, or one or more added features which can advantageously be selected alone or in combination to include the following:

wherein the transfer implement has at least one arm which extends into the rotor when the transfer implement is loading or unloading semiconductor articles relative to the rotor;

plural semiconductor holding features being at least partially provided on said at least one arm;

plural arms which extend into the rotor when the transfer implement is loading or unloading semiconductor articles relative to the rotor;

at least one retainer actuator which interacts with portions of the rotor to affect the position of the at least one movable article retainer relative to the rotor frame;

wherein the at least one movable article retainer is pivotally connected to the rotor frame;

wherein the at least one movable article retainer is configured to force the semiconductor articles into the desired processing positions when the rotor is rotated;

wherein the at least one movable article retainer is pivotally connected to the rotor frame and balanced to force the semiconductor articles into the desired processing positions when the rotor is rotated and centrifugal forces are developed thereon;

said at least one movable article retainer further being spring biased when in a closed or an open position or both positions;

at least one retainer operator which operates the at least one movable article retainer in movable relationship to the rotor frame to effect automatic operation of the at least one movable article retainer to develop force against semiconductor articles held in the receiver during rotation of the rotor;

wherein there are a plurality of movable article retainers;

wherein the rotor frame encircles the receiver;

and a vision subsystem including a vision detector for detecting the relative position of the rotor and rotor transfer implement.

In still another aspect the invention includes a centrifugal processing system for centrifugal treatment of batches containing a plurality of semiconductor articles, comprising:

a frame;

a batch transfer robot which is movable relative to the frame;

at least one processing station mounted in sufficient proximity to the batch transfer robot to allow transfer of batches to and from the at least one processing station, said at least one processing station having:

a processing vessel which defines a processing chamber therein;

a rotor frame mounted for controlled rotation within the processing chamber;

a receiver on the rotor frame for receiving a batch containing a plurality of semiconductor articles;

at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position;

a transfer implement mounted upon the batch transfer robot having plural semiconductor holding features for holding the plurality of semiconductor articles in suitable transfer positions for being received within the receiver.

In still further aspects the centrifugal processing system for centrifugal treatment of batches is advantageously embodied in the combination indicated above with less than the stated features, or one or more added features which can advantageously be selected alone or in combination to include the added features specified above in connection with the centrifugal process rotor and the rotor and rotor transfer implement combination.

In still another aspect the invention includes methods for centrifugally processing batches of semiconductor articles, comprising:

supporting plural semiconductor articles in a batch array upon a transfer implement;

moving the transfer implement into a processing station having a process chamber opening which opens to a processing chamber defined within a processing vessel; said processing station further having a rotor which includes a rotor frame which is mounted for rotation within the process chamber;

positioning the transfer implement within a receiver which is on the rotor frame;

engaging the batch array with the receiver to support the plural semiconductor articles using the receiver;

repositioning at least one movable article retainer which is movably mounted upon the rotor frame into a closed position wherein the at least one movable article retainer is in juxtaposition with the plural semiconductor articles held in the receiver; said at least one movable article retainer serving to maintain the semiconductor articles at desired processing positions on the rotor when the at least one movable article retainer is in a closed position.

In still further aspects the methods for centrifugally processing batches of semiconductor articles are advantageously embodied in the combination indicated above with less than the stated features, or one or more added features which can advantageously be selected alone or in combination to include the following:

retracting the transfer implement from the processing chamber;

closing the processing chamber opening using a movable processing chamber door to provide a substantially enclosed processing chamber;

rotating the rotor and supported plural semiconductor articles within the processing chamber;

opening the processing chamber opening by retracting the movable processing chamber door;

moving the transfer implement into the processing station;

repositioning the at least one movable article retainer which is movably mounted upon the rotor frame into an open position wherein the at least one movable article retainer is spaced from the plural semiconductor articles held in the receiver;

engaging the transfer implement with the batch array to support the plural semiconductor articles upon the transfer implement;

retracting the transfer implement and supported batch array from the processing station.urging the plural semiconductor articles using a centrifugally motivated article retainer operator to apply added force maintaining the plural semiconductor articles in the desired processing positions during rotation of the rotor and supported batch array.

Additional features some or all of which are of potential patentable significance are further included in the more detailed description given below which explains some current preferred forms of implementing the invention with added aspects and variations.

BRIEF DESCRIPTION OF THE DRAWINGS

One or more preferred forms in the invention are described herein with reference to the accompanying drawings. The drawings are briefly described below.

FIG. 11 is a perspective view showing portions of the rotor and transfer implement shown in FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and the useful arts" (Article 1, Section 8).

Processing System Generally

Figure 1:
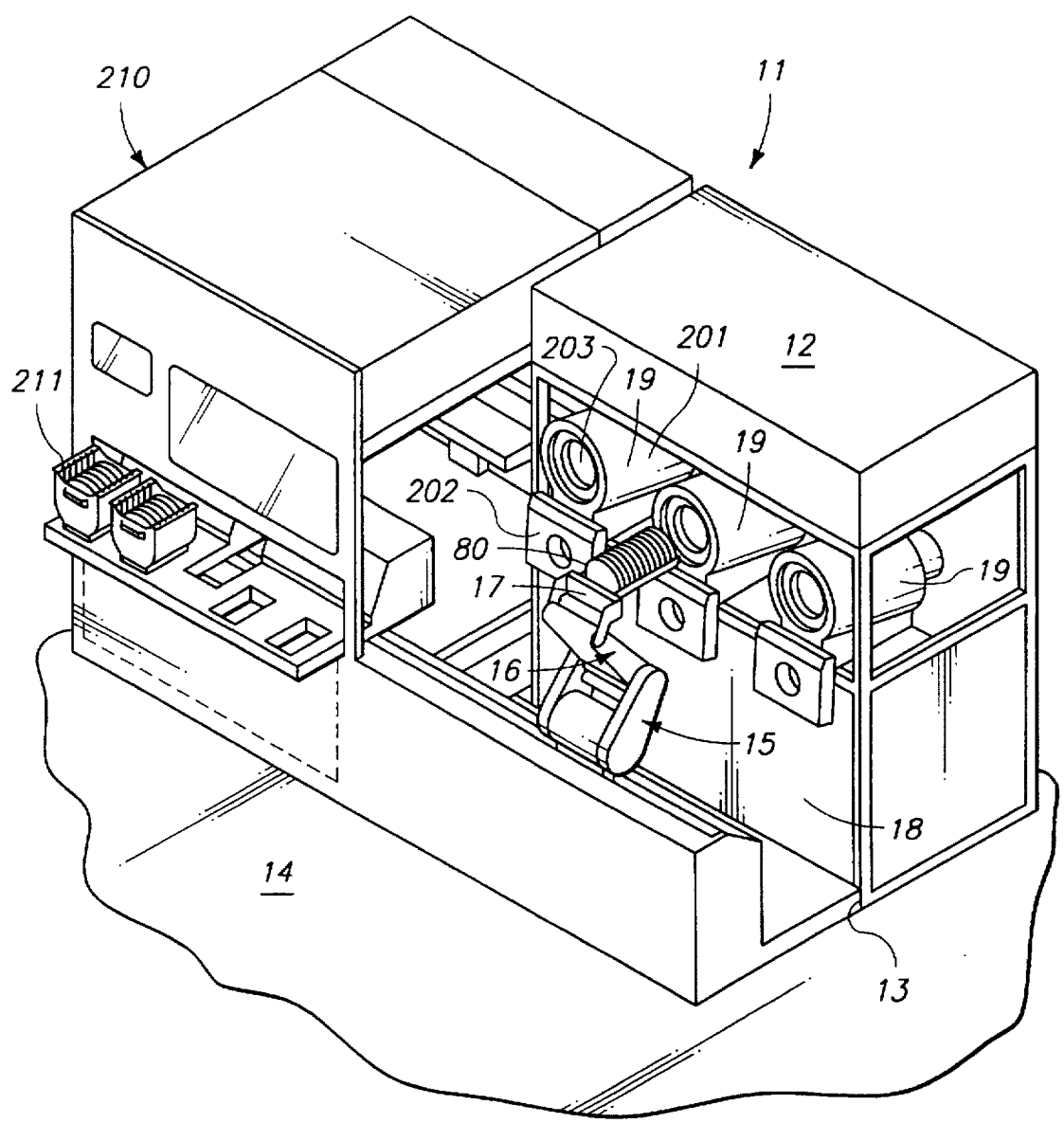
FIG. 1 is a perspective view of a wafer processing system which can advantageously employ the present invention.
Figure 3:
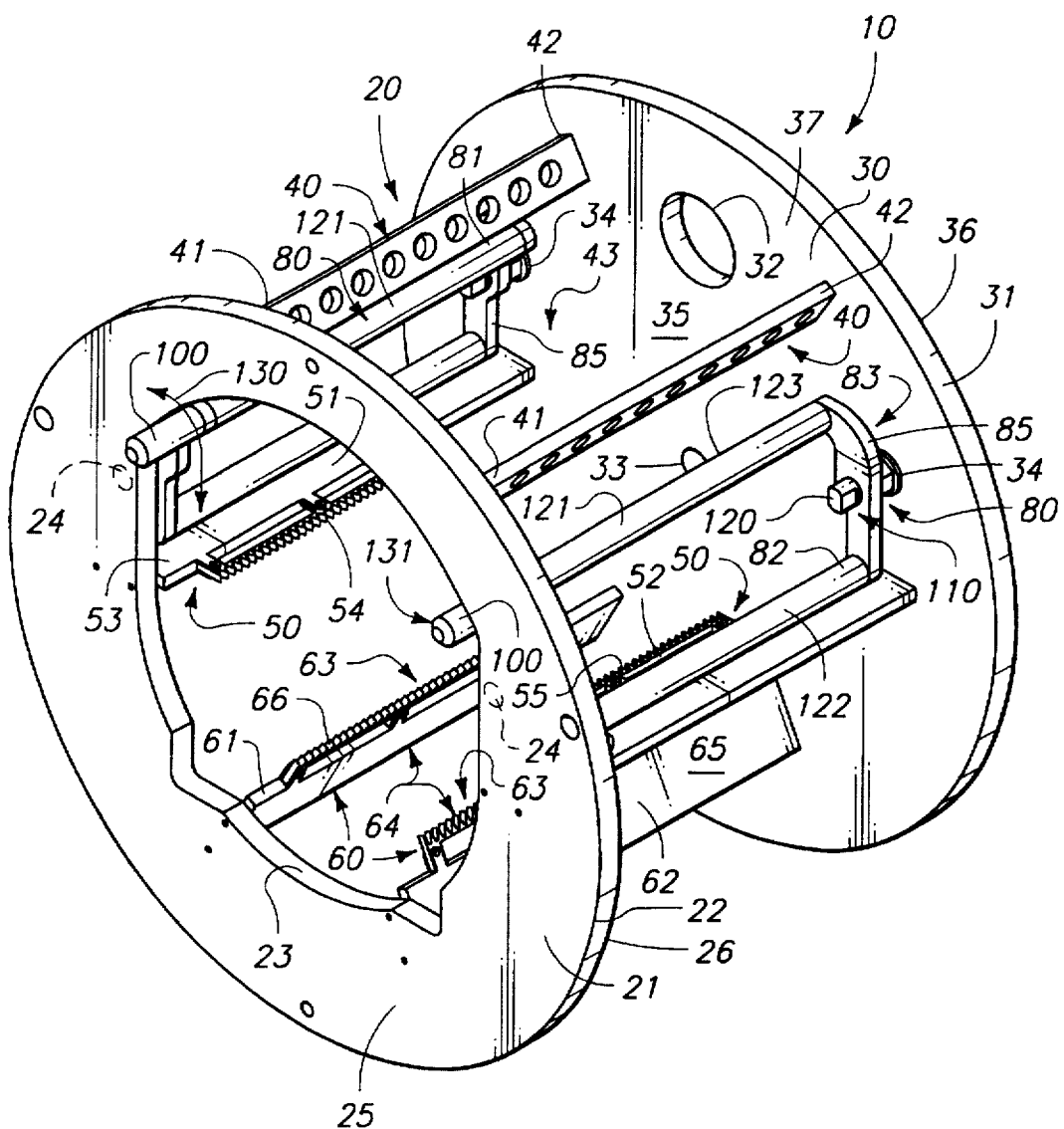
FIG. 3 is a perspective view of a preferred centrifugal processor rotor according to the invention.

A first embodiment of preferred centrifugal processor rotor according to the present invention is generally indicated by the numeral 10 in FIG. 3. As best illustrated in FIG. 1, the centrifugal processor rotor forms part of a larger machine or processing apparatus or system 11. The processing system includes a frame 13 which is connected with a housing 12. The housing 12 and frame 13 rests upon a supporting surface 14. The housing is most preferably constructed to fully enclose the machine and define a working space 18 within which wafers or other semiconductor articles are moved and processed in relative protection from dust and contamination. FIG. 1 does not show the full enclosure of housing 12 to improve the illustration.

FIG. 1 further shows a robotic transfer device, which is generally indicated by the numeral 15. Robotic transfer device 15 is mounted upon and moves relative to the frame to deliver semiconductor articles 80 to the washing apparatus 11. As shown, the semiconductor articles are arranged in a linear batch array in which the individual articles are spaced, parallel and aligned with central normal axes of the disk-shaped wafers substantially aligned to form a longitudinal central batch axis (axis not illustrated). The robotic device can be of various designs One design is that available from Semitool, Inc. of Kalispell, Mont. under the trademark MAGNUM. Further detailed description of suitable transfer devices and other aspects of the processing system can also be implemented in a manner shown in described in the pending U.S. patent applications Ser. No. 08/236,424 filed Apr. 28, 1994 now U.S. Pat. No. 5,544,421; Ser. No.

08/415,927 filed Mar. 31, 1995 U.S. Pat. No. 5,660,517; Ser. No. 08/415,240 filed Apr. 3, 1995 now U.S. Pat. No. 5,678,320 which are hereby incorporated by reference in their entirety. Such forms of apparatus are also described in corresponding PCT Applications which were published by the World Intellectual Property Organization under PCT Publication Nos. WO 95/30238; WO 95/30240; WO 30239; all of which are incorporated by reference.

In the preferred robotic transfer device 15 the construction includes an articulated arm 16 which can be oriented into various planes of orientation and position. The transfer device has a distal end 17 which is used to mount a transfer implement which is preferably of the construction detailed below or equivalents thereto. The distal end 17 may move along assorted courses of travel to deliver the semiconductor articles to various individual or plural work stations 19. Each of these various courses of travel will be discussed in greater detail, hereinafter. While the present invention is described as being useful in combination with a washing or chemical processing stations, it will be appreciated that the same device may find utility in other applications.

The individual processing stations 19 can be of various constructions. In the preferred form of the invention, the processing stations 19 each include a processing vessel 201 which partially encloses a processing chamber defined therewithin. The processing vessels also preferably mate with a movable door 202 which can be retracted into the open positions shown in FIG. 1, or moved upwardly by sliding action to cover the processing vessel main opening 203.

FIG. 1 also shows an input-output module 210 which takes wafers presented in a suitable form, such as the wafer batches in carriers 211 and transfers the wafers from the carriers onto the transfer implement 140 (FIG. 2) which is mounted upon the distal end of the mechanical arm forming part of the robotic transfer device 15. Differing constructions of carrier transfer apparatuses can be included as part of module 210, and such modules do not comprise a part of the inventions which are the subject of this application. Further description can be had from the documents incorporated by reference hereinabove.

First Embodiment Processing Rotor

Figure 2:
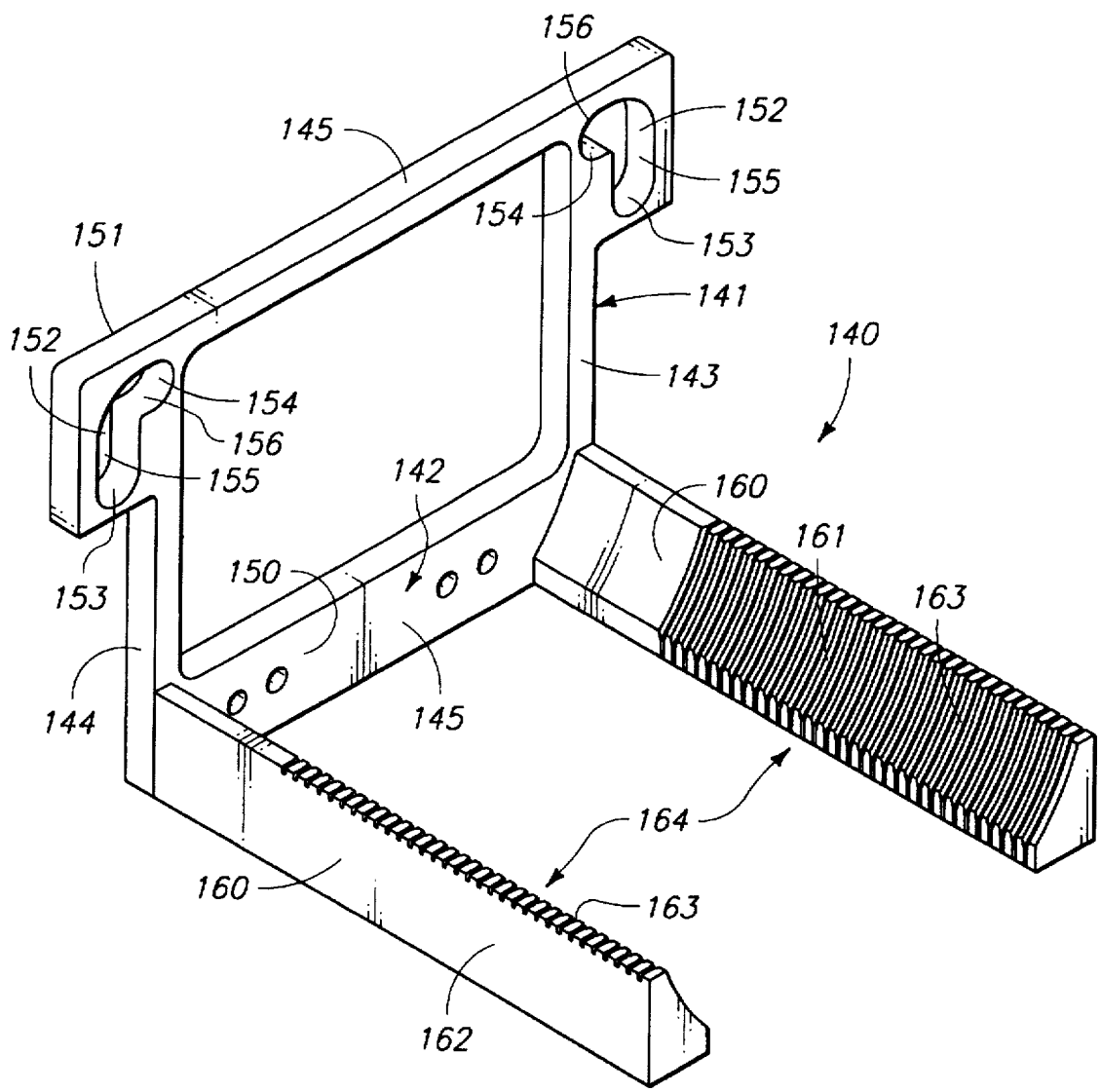
FIG. 2 is a perspective view of a transfer implement which is utilized in the invention.

FIGS. 4–7 show a first preferred embodiment of rotor 20 and article transfer implement 140 in different positions in order to illustrate the various features of each and their cooperation to perform the novel operational methods described herein. FIG. 2 shows the transfer implement 140 alone. FIG. 3 shows the rotor alone.

The centrifugal processor rotor 10 includes a rotor frame 20. The rotor frame has a front portion or plate 21 which is defined by a peripheral edge 22. The front portion 21 further defines a substantially centrally disposed opening or aperture 23, and a pair of mounting apertures 24. The front portion or plate 21 has a forwardly facing surface 25, and an opposite rearward facing surface 26. Mounted in suitable relationship, such as the substantially parallel spaced relationship relative to the front plate 21, is a rear portion or second plate 30. The rear portion 30 has a peripheral edge 31, and further defines a major aperture 32, and a minor aperture 33. The minor aperture is disposed in substantially coaxial alignment relative to the axis of rotation of the rotor frame 20.

The rear portion further defines a pair of mounting apertures 34. The rear portion 30 has a main body 35 which is substantially planar, and circular in shape, and which has substantially the same diametrical dimensions as the front portion 21. The main body 35 is further defined by an exterior facing surface 36, and an opposite, interior facing surface 37, respectively.

The individual front and rear portions 21 and 30, respectively, are held together in a suitable construction, such as the illustrated substantially coaxial and parallel spaced relation by means of rotor frame members 40 which are spaced about the rotor. Each of the rotor frame members 40 have a first end 41, which is fixed on the front portion 21 by utilizing conventional fastening methods, and an opposite, second or distal end 42, which is mounted on the rear portion 30 by using the same techniques The location of the first and second plates in the given orientation described above defines a processing cavity 43 therebetween.

As best seen by reference to FIG. 3, a pair of laterally disposed support members, or combs 50 are borne by the rotor frame 20 and are positioned in the cavity 43. The combs 50 include a first comb 51, and an opposite, second comb 52 which are individually affixed on the interior facing surfaces 26 and 37 of the first and second portions 21, and 30 respectively. The first and second combs extend substantially normally outwardly relative to the surfaces 26 and 37, as shown. The first and second combs 51 and 52 are disposed to hold the wafers or other semiconductor articles being processed. This can advantageously be in the form of the illustrated substantially parallel, spaced configuration shown.

Each of the first and second combs has a frame portion 53, which is affixed on the front portion 21, and the rear portion 30, by using conventional fastening techniques Further, each of the first and second combs has a comb portion 54 which is defined by an undulating peripheral edge 55. The undulating peripheral edges 55 are positioned in inwardly facing relation, one to the other, and are operable to engage the semiconductor articles as will be discussed in further detail in the paragraphs which follow. The peripheral edge may be provided in various materials or with various surface coatings which will protect the semiconductor articles which come into contact with same. One preferred construction utilizes a tetrafluoroethylene polymer plastic material. Others materials and constructions are alternatively possible.

FIG. 3 further shows a pair of base combs, identified hereinafter as first and second base combs 61 and 62, respectively. These base combs are affixed by conventional fastening techniques on the front and rear portions 21 and 30 respectively. The pair of base combs are shown disposed in parallel spaced relationship, and are generally aligned with the rotational axis of the rotor. The first and second base combs, in combination with the first and second laterally disposed combs 51 and 52, define an article receiving assembly or receiver 63 which is operable to hold, support or cradle the articles in desired processing positions. The receiver is also preferably constructed to otherwise orient the semiconductor articles in substantially coaxial alignment relative to the axis of rotation of the rotor frame 20.

Figure 5:
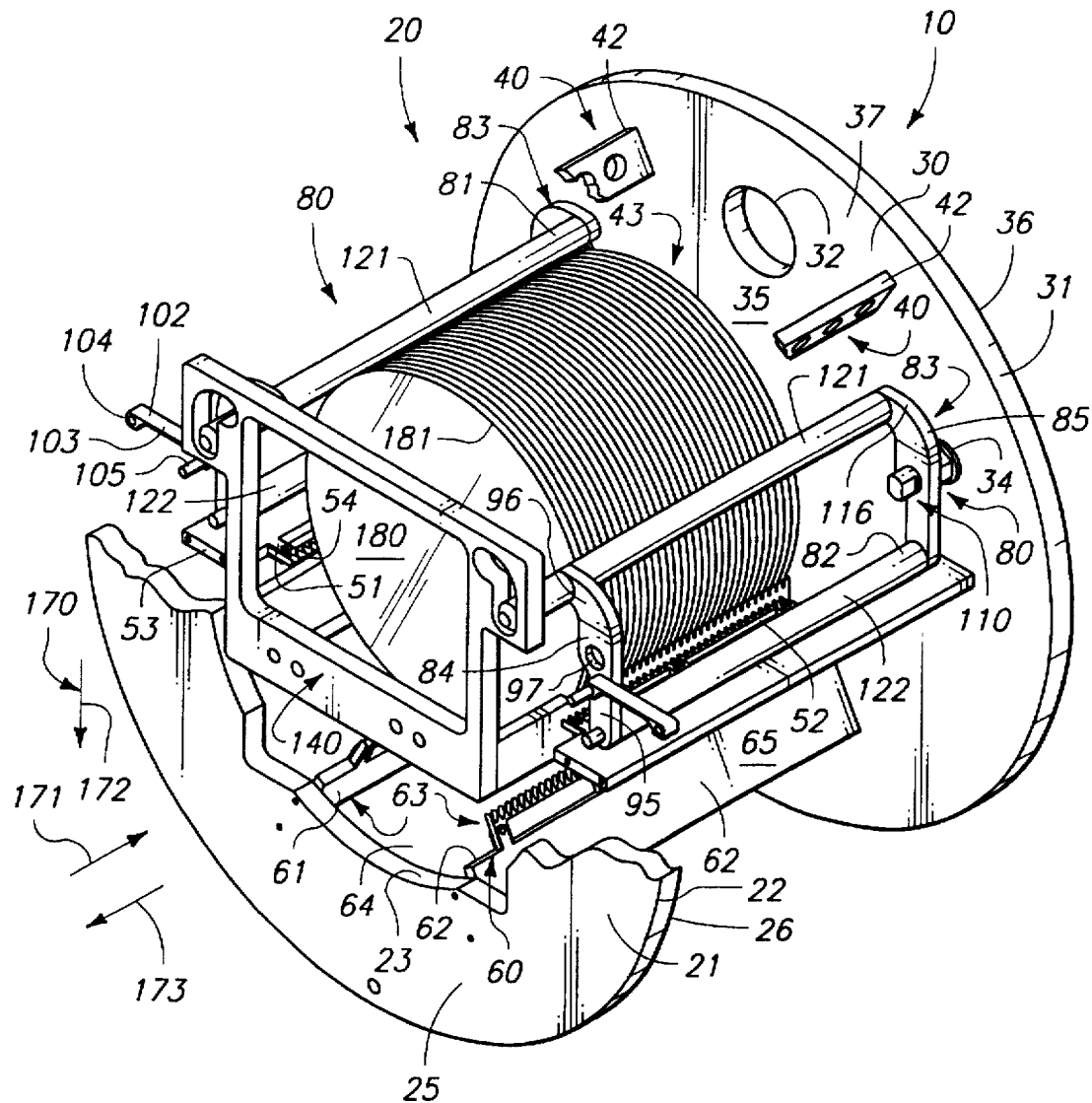
FIG. 5 is a fragmentary, perspective view of the centrifugal processor rotor shown in FIG. 3, at a processing step subsequent to that shown in FIG. 4. Some portions are removed to show the underlying structures.

FIG. 5 shows that the base combs define a gap 64 therebetween and which has a given cross-sectional dimension. The individual base combs 61 and 62 each have a frame portion 65 which is affixed on the surfaces 26 and 37 respectively. The individual base combs further include an undulating peripheral edge 66 having receiving grooves and interposed projections.

As best illustrated by reference to FIGS. 4 and 5, the centrifugal processor rotor 10 includes a pair of retainer assemblies 80. The retainer assemblies 80 will be identified hereinafter as a first retainer assembly 81, and a second retainer assembly 82, respectively. As will be appreciated by a study of the drawings, the first and second retainer assemblies 81, and 82 are substantially mirror images of each other, and therefore the features of only one of the retainer assemblies will described in detail hereinafter. Each retainer assembly 80 includes a pair of end pieces 83. The end pieces are identified as a first or forward end piece 84, and a second or rearward end piece 85. The first end piece 84 has a main body 90 which has a first end 91, and an opposite second end 92. The main body is further defined by an interior facing surface 93, and an opposite, exterior facing surface 94. The main body 90 also has a substantially linear portion 95, and a curved portion 96.

Figure 4:
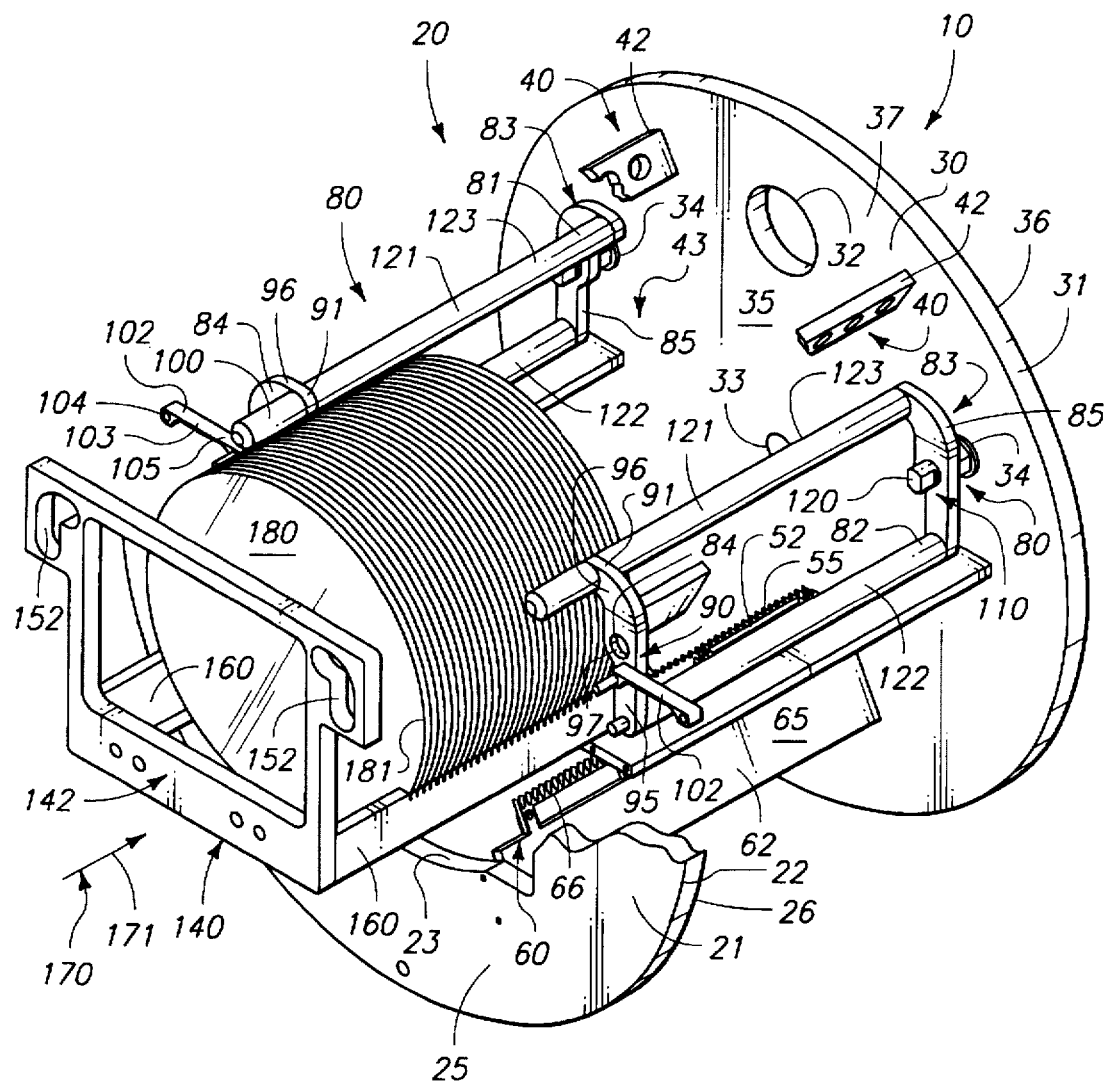
FIG. 4 is a fragmentary, perspective view of the centrifugal processor rotor of FIG. 3, with the some portions removed to better show underlying structures

As illustrated in FIG. 4, the main body 90 is substantially curvilinear in its overall shape. A centrally disposed aperture 97 is formed in the linear portion 95. Further, an engagement member 100 extends normally outwardly relative to the exterior facing surface 94. A biasing member or spring 102 is borne by the rotor frame 20. The spring has a main body 103, with a first end 104 which is fixed by a conventional fastener on the rear surface 26 of the front portion 21; and a second end 105,which is fixed in a predetermined location on the linear portion 95 of the main body 90. The operation of the biasing member or spring 102 will be discussed in greater detail hereinafter. As will be recognized, from a study of FIGS. 3 and 4, the main body 90 is mounted for rotational movement about a front pin (not shown) and which is received in the individual mounting apertures 24. The mounting pin is further in mating relationship and received in the aperture 97.

FIG. 5 illustrates that the second end piece 85, of the respective retainer assemblies 80, has a main body 110 which includes a first end 111, and an opposite, second end 112. The main body 110 further is defined by an interior facing surface 113; an opposite, exterior facing surface 114; a linear portion 115; and a curved portion 116 which is positioned at the first end 111 thereof. A centrally disposed aperture 117 is formed in the linear portion 115. A rear pin 120 is received in mating relation in the aperture 34. The rear pin 120 is also received in the central aperture 117 thereby rendering the main body 110 rotatable about the rear pin 120.

Fastened on the first end 91 and 111 of the first and second end pieces 84 and 85 respectively, is a first longitudinally disposed member 121. Further, fixed on the second end 92 and 112 of the first and second end pieces 84 and 85, respectively is a second, longitudinally disposed member 122. The first and second longitudinally disposed members 121, and 122 are suitably oriented, such as in the fixed substantially parallel spaced relationship shown. These members are also further oriented in substantially parallel relationship to the axis of rotation of the rotor frame 20.

The first longitudinally disposed member 121 includes an inside facing peripheral edge 123 which is coated with a material that does not harm or contaminate the semiconductor articles which are being processed.

Figure 6:
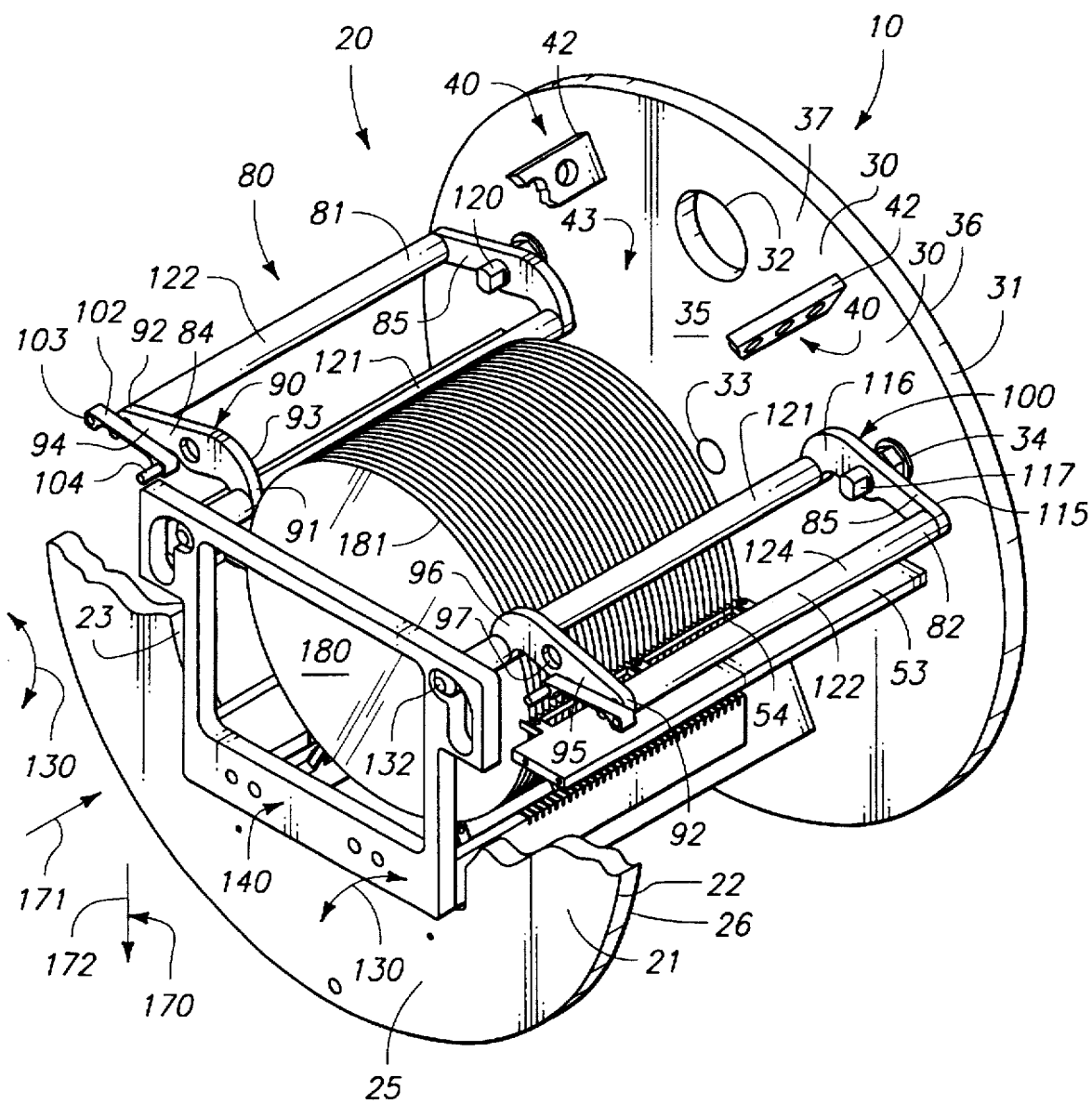
FIG. 6 is a fragmentary, perspective view of the centrifugal processor rotor shown in FIG. 3, at a processing step subsequent to that shown in FIG. 5. Some portions are removed to show the underlying structures.

The respective retainer assemblies 80 move along predetermined paths of travel 130 between a first, or open position 131 (FIG. 3), and a second, or closed position 132 (FIG. 6). As will be recognized by a study of FIG. 7, the respective retainer assemblies 80, when disposed in the second position 132, secure the individual semiconductor articles on the object receiving assembly 63 for centrifugal processing. Further, it should be understood that when the individual retainer assemblies 80 are positioned in the second position 132 (FIG. 7), the second longitudinally disposed members 122 are operable, under the influence of centrifugal force imparted to the respective longitudinally disposed members 122 by the rotation of the rotor frame 20, to exert radially inward forces on the semiconductor articles thereby securing them in substantially coaxial alignment relative to the rotor frame 20.

The centrifugal processor rotor 10 of the present invention works in combination with a transfer implement which is designated generally by the numeral 140 in FIG. 2. The transfer implement 140 includes a face plate 141 which is releasably secured on the distal end 17 of the arm 16. The face plate has a main body 142 which is defined by a left portion 143; a right portion 144; and bridging portions 145 which connect the left and right portions 143 and 144 together. Further, the face plate 141 includes an inside facing surface 150, and an outside facing surface 151. The outside facing surface is releasably secured in juxtaposed relation relative to the distal end 17 of the robotic arm 16.

A pair of apertures, 152 are individually formed in the face place 141. In this embodiment, the individual apertures have a first end 153; and an opposite, second end 154. The respective apertures further have a vertically oriented portion 155, and a substantially horizontally oriented portion 156. As best seen by reference to FIG. 49 the individual apertures 152 are substantially curvilinear in shape.

The transfer implement 140 includes a pair of arms 160 which extend substantially normally, outwardly relative to the inside facing surface 150 of the main body 142. In this regard, each of the arms includes a first arm 161, and a second arm 162 of substantially identical dimensions. Each of the arms 161 and 162 has a generally upwardly oriented surface which has a number of repeating undulations or grooves 163 formed therein. The upwardly facing surface may be coated or treated with a material which protects and does not substantially contaminate the semiconductor articles while being transported.

Figure 7:
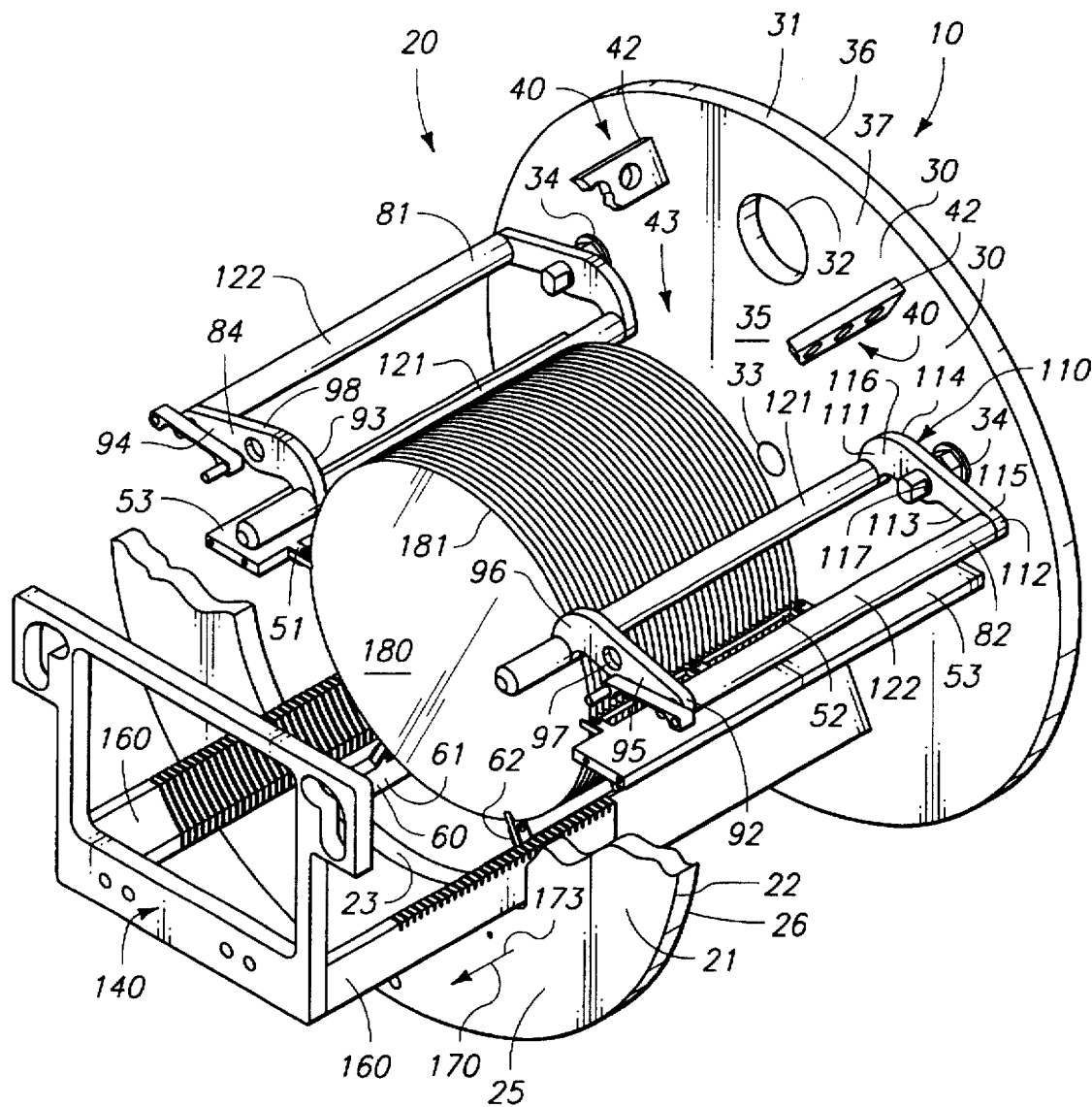
FIG. 7 is a fragmentary, perspective view of the centrifugal processor rotor shown in FIG. 3, at a processing step subsequent to that shown in FIG. 6. Some portions are removed to show the underlying structures.

As best seen by reference to FIGS. 2 and 7, a gap 164 is defined between the first and second arms 161, and 162. It should be recognized that the gap 164 is larger than the gap 64 which is defined between the first and second base combs 61 and 62 respectively.

The transfer implement 140 is moveable along a given course of travel 170. The course of travel comprises a first component 171, (FIG. 4); a second component 172 (FIGS. 5 and 6); and a third component 173 (FIG. 7). The first and third components 171, and 173, are substantially parallel to each other, and the second component 172 is substantially transversely disposed relative to the first and second components. As will be recognized, the transfer implement 140, while traveling along the first course of travel 171, cooperates with the individual engagement members 100 at the end of the first course. Continued movement of the transfer implement 140 along the second component 172, imparts force to the retainer assemblies, thereby effectively urging the retainer assemblies along their respective paths of travel 130, from the first position 131, to the second position 132. Further, the movement of the transfer implement 140 along the second course 172 brings the semiconductor articles, here illustrated as a plurality of silicon wafers 180 into resting relation onto the object receiving assembly 63.

FIG. 4 shows that the transfer implement carries the individual wafers or other articles in spaced, substantially parallel relation in a batch array.

The transfer implement 140 while moving along the first course of travel 171 cooperates with the respective engagement members 100 by receiving the respective engagement members in the individual apertures 152. As seen in FIG. 5, when the transfer implement 140 is located at the end of the first course 171, and at the beginning of the second course 172, the respective engagement members are located at the first end 153 of the individual apertures 152. As best understood by a comparison of FIGS. 5 and 6, movement of the transfer implement 141 along the second course 172 has the effect of urging the individual engagement members along the sides of the respective apertures 152, from the first end 153, to the second end 154 thereof. This movement of the engagement members 100 along the individual apertures 152 draws the engagement members 100 generally radially inwardly, thereby defining the paths of travel 130 which are substantially arcuate in shape (FIG. 3). It is also noteworthy that the apertures 152 are shaped to allow installation over the engagement members 100 for the entire range of positions which the engagement members can assume.

The article or object receiving assembly 63 carries or cradles the individual silicon wafers 180 in substantially the same orientation as the transfer implement 140. FIG. 7 shows that the object receiving assembly 63 passes through the gap 164 which is defined between the first and second arms 161 and 162 as the transfer implement 164 moves along the second course of travel 172. Once the plurality of wafers 180 are disposed in rested relation on the article receiving assembly 63, the transfer implement 140 moves along the third course of travel 173 out of the cavity 43. As will be seen by a study of FIG. 7, the movement of the individual retainer assemblies 80 along the paths of travel 130 between the first position 131 and second the position 132 orients the first longitudinally disposed members 121 in tangential, force engaging relation relative to the peripheral edge 181 of wafers 180. This effectively secures the individual wafers in substantially coaxial alignment relative to the axis of rotation of the rotor frame 20.

Upon rotation of the rotor frame 20, the second longitudinally disposed member 122 is acted upon by centrifugal force thereby further urging the first longitudinally member 121 into increased radially inward force transmitting relation relative to the wafers 180.

In addition to the centrifugal biasing which occurs, the biasing member 102 is a spring or other member which operates when the retainer assemblies 80 are in their first, or open position 131 to bias and urge the retainer assemblies 80. The retainers are biased in the direction of the first position 131, and in the direction of the second position 132. This accomplishes the desired conditions of either being held in the opened or closed retainer positions.

To remove the individual wafers 180 from the rotor frame 20, the reverse of the process outlined above would be followed. In particular, the transfer implement 140 would move along the third course of travel 173 into the cavity 43. At the end of the third course of travel 173, the engagement members 100 would be received in the apertures 152, and oriented at the second end 154 thereof. The transfer implement 140 would then travel along the second course of travel 172, in the direction of the first course 171. This movement of the transfer implement 140 effectively moves the engagement members along the path of travel 130, from the second position 132, to the first position 131. As will be recognized, this movement causes the longitudinally disposed members 121 to move out of tangential force engaging relation relative to wafers 180.

At the end of the second course, the engagement members 100 are oriented at the first end 153 of the respective apertures. Further, as the transfer implement 140 moves along the second course 172, the individual arms 160 engage, and cradle the wafers 180 thereby lifting them out of engagement with the article receiving assembly 63. The transfer implement then moves along the first course of travel 171 out of the cavity 43 and on to another work station.

Operational Description of First Embodiment

The operation of the preferred embodiment of the present invention is believed to be readily apparent but is briefly summarized at this point.

The centrifugal processor rotor 10 is best seen by a reference to FIG. 3. The centrifugal processor rotor 10 for treating semiconductor articles, such as silicon wafers 180, includes a rotor frame 20 defining a cavity 43. A retainer assembly 80 is borne by the rotor frame 20 and positioned in the cavity 43. The retainer assembly 80 is moveable along a path of travel 130 from a first, open position 131, to a second closed position 132. An object receiving assembly 63 is borne by the rotor frame 20 and positioned in a given location in the cavity 43. The object receiving assembly 63 supports the semiconductor articles in the cavity 43 for centrifugal processing.

Still another aspect of the present invention includes a centrifugal processor rotor 10 for treating semiconductor wafers 180 comprising a rotor frame 20 defining a cavity 43 and having a predetermined axis of rotation. A pair of retainer assemblies 80 are borne by the rotor frame. Each retainer assembly 80 is rotatable about a given axis, and has at least one member 121 which moves along a given path of travel 130 from a first position 131 to a second position 132. An object receiving assembly 63 is borne by the rotor frame 20 and is located in the cavity 43. The object receiving assembly positions the semiconductor wafers 180 in substantially coaxial alignment relative to the axis of rotation of the rotor frame 20. A transfer implement 140 is moveable along a course of travel 170 into, and out of, the cavity 43. The transfer implement 140 supports the plurality of silicon wafers 180 in a predetermined orientation. Upon movement of the transfer implement 140 along the course of travel 170, the transfer implement 140 cooperates with the retainer assemblies 80, and further movement of the transfer implement 140 along the course of travel 170 following mating cooperation with the retainer assemblies 80, carries the semiconductor wafers 180 into resting relation onto the object receiving assembly 63. This movement of the transfer implement 140 along the course of travel 170 simultaneously urges the longitudinally disposed members 121 of the respective retainer assemblies 80 along their individual paths of travel 130 from the first position 131, to the second position 132.

Still a further aspect of the present invention includes a method for centrifugally treating a plurality of semiconductor wafers 180. The method for treating semiconductor wafers 180 comprises providing a rotor frame 20 which defines a cavity 43; providing a movable retainer assembly 80 which is borne by the rotor frame 20, and which moves along a given path of travel 130; providing an object receiving assembly 63 which is borne by the rotor frame 43; providing a transfer implement 140 which is moveable along a given course of travel 170, and which carries the plurality of silicon wafers 180 in a predetermined orientation into the cavity 43; urging the transfer implement 140 along the course of travel 170, the transfer implement 140 while moving along the course of travel 170 cooperating with the retainer assembly 80, and effectively imparting force to the retainer assembly 80 to urge the retainer assembly 80 along its respective path of travel 130, while simultaneously carrying the individual wafers 180 into rested relation onto the object receiving assembly 63. The retainer assembly 80 secures the individual semiconductor wafers 180 in fixed substantially coaxial orientation relative to the rotor frame 20. The method further includes the step of imparting rotational movement to the rotor frame 20 thereby creating centrifugal force which acts upon the respective semiconductor wafers 180 by means of the retainer assembly 80.

Therefore, the centrifugal processor rotor 10 of the present invention provides a convenient means by which semiconductor articles, such as a plurality of semiconductor wafers 180, can be centrifugally processed in a manner which avoids the shortcomings identified with the prior art practices and other devices.

Description of Second Preferred Embodiment

FIGS. 8–11 show a further preferred rotor and transfer implement combination according to this invention. This combination includes a rotor assembly 310 which bears similarity to rotor 10 described above. Parts which are common to both rotor constructions and transfer implement constructions are similarly numbered with regard to the second embodiment using numbers in the 300's and 400's in lieu of numbers ranging from 10 up into the 100's. Corresponding parts with corresponding reference numbers are determined by adding 300 to the first embodiment reference numbers. Not all features have been numbered in both embodiments to simplify and clarify the illustrations. Description of the common features of both embodiments will not be repeated. Additional description is provided below in connection with changed or noteworthy aspects of the second embodiment.

Figure 8:
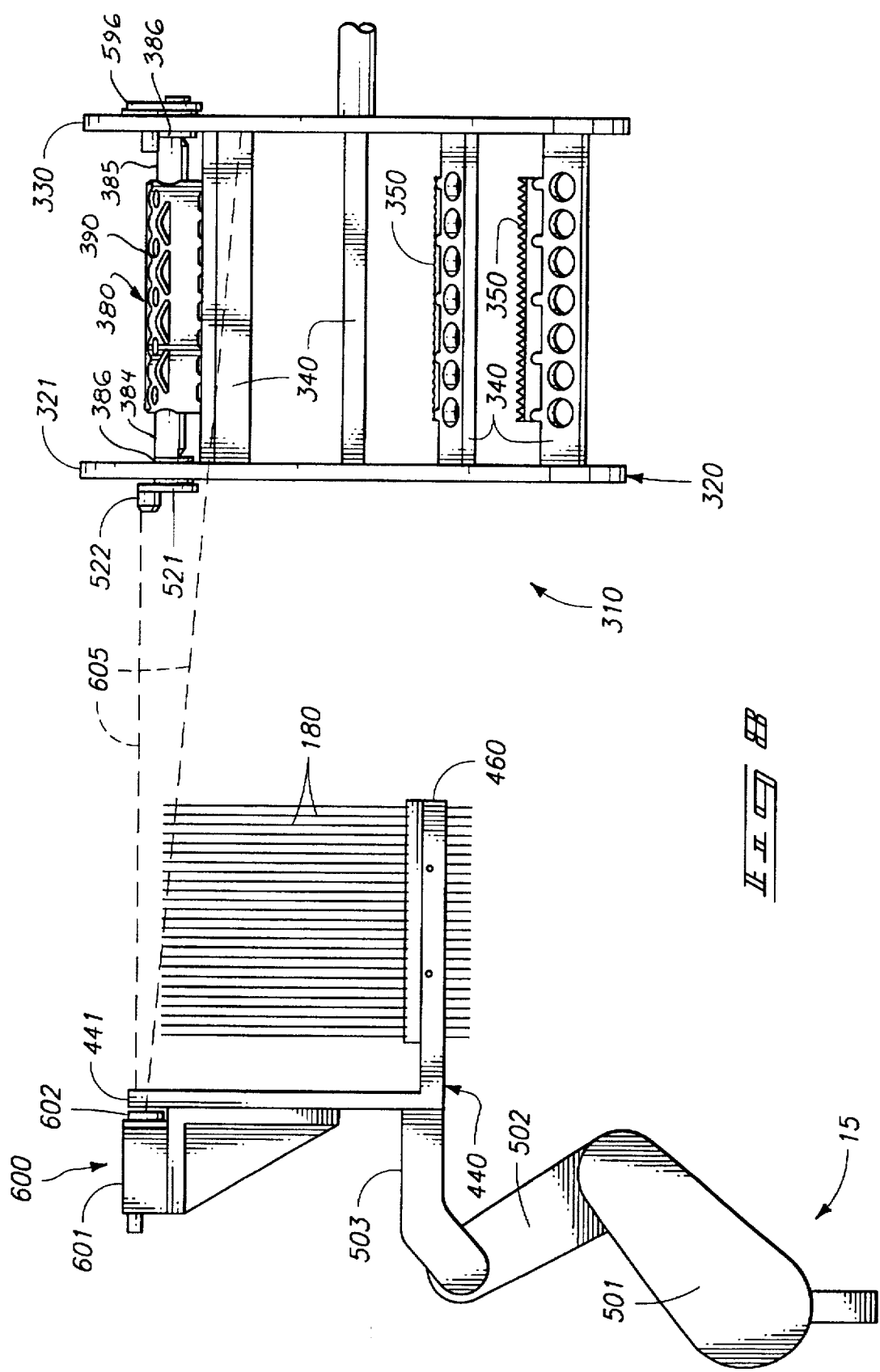
FIG. 8 is a side elevational view showing a further embodiment of the invention having a rotor and transfer implement mounted upon a robotic arm assembly.

FIG. 8 shows the robotic transfer device 15 having first, second, and third arm portions 501, 502 and 503, respectively; which can also be thought of as upper arm 501, forearm 502 and hand 503. The second embodiment transfer implement 440 is mounted at the distal end of the mechanical arm assembly 15.

The transfer implement has cantilevered arm members 460 which extend from the face plate 441. The upper and inward surfaces of the arm members have array support features in the form of grooves 463 (FIG. 11) and intervening ridges or projections which act to space the wafers 180 into the spaced parallel batch array.

The face plate also serves as a retainer actuator in the form of two apertures 452 which are appropriately shaped to provide camming or similar displacement action when the implement is engaged and moved relative to lever arms 521. Lever arms 521 are pivotally mounted in the front rotor plate 321.

Figure 9:
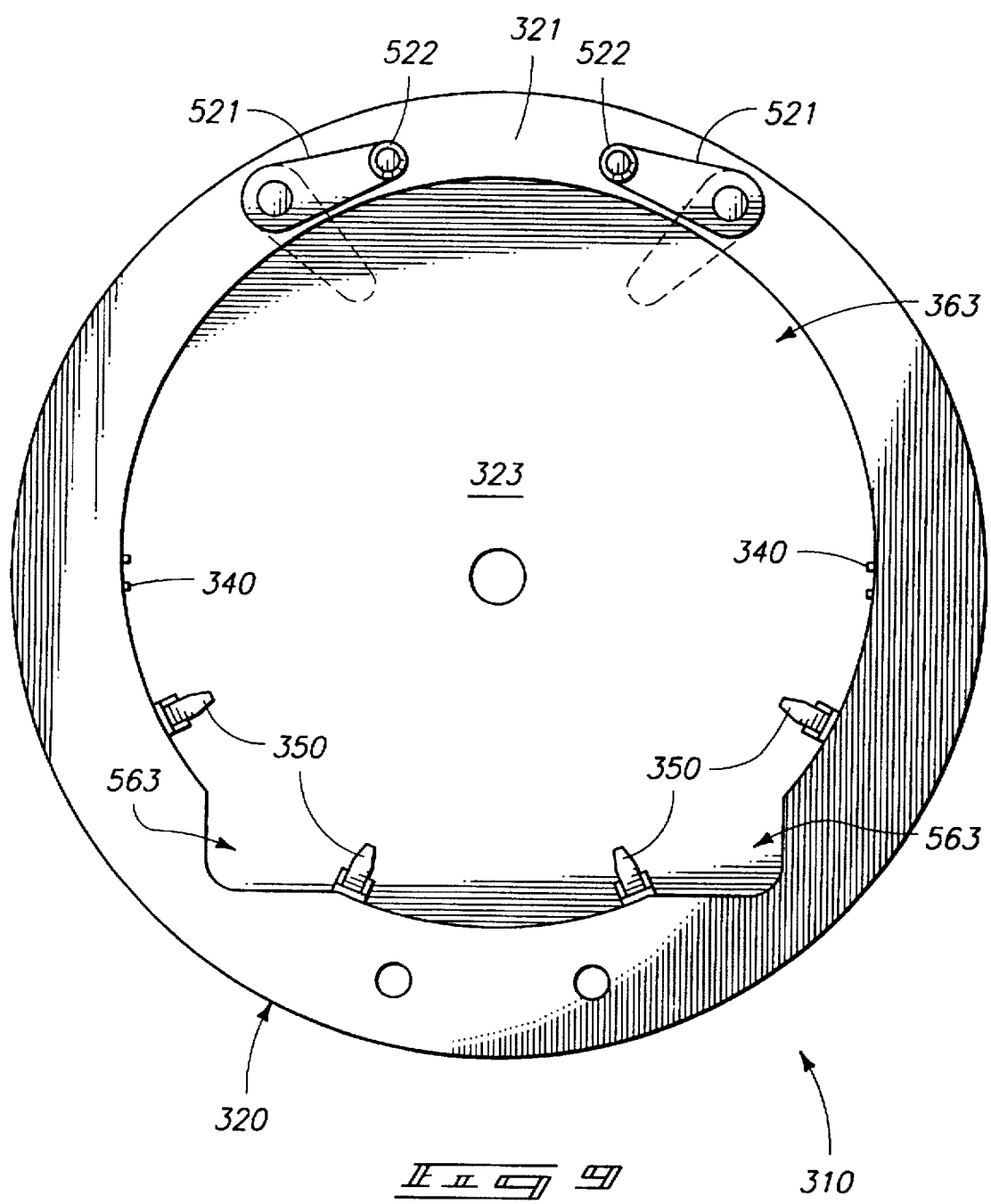
FIG. 9 is a front elevational view of the rotor shown in FIG. 8.

Apertures 452 form part of an article retainer operator which functions to pivot lever arms 521. FIG. 9 shows how the lever arms can be pivoted between upper or retracted open positions shown in solid lines, and lower or contracted closed positions shown in phantom lines. This is accomplished by lowering the transfer implement downwardly from the upper or loading and unloading position shown in FIG. 10 to a lowered retracted position shown by phantom lines 531 in FIG. 10. To function in this capacity the retainer operator apertures 452 are positioned over the lever arm end extensions 522. The transfer implement is then raised to move the lever arms up and into the open positions. The transfer implement is lowered to move the lever arms down and into extended or closed positions.

FIG. 8 further illustrates that the transfer implement 440 can be used to mount a visual sensing subsystem 600. Visual sensing subsystem 600 is advantageously used to monitor the position of the transfer implement, and to monitor the condition of the rotor. The visual sensing subsystem utilizes a television camera or similar image detection device 601. Image detector 601 can be a charge coupled device image detector similar to video cameras or other suitable sensors. The image detector 601 has a light gathering lens 602 which collects light beamed toward the lens over a viewing range which is only partially suggested by view lines 605 shown in FIG. 8. The lens 602 is positioned adjacent to a viewing opening 611 (FIG. 10) formed in the transfer implement face plate 441. The image detector 601 is advantageously mounted to the face plate 441 using a camera mounting bracket 613 which is adjustably secured thereto using suitable fasteners 614 which are received through slotted mounting apertures 615 which allow vertical adjustment. The camera can alternatively be mounted directly upon the robot or at other suitable locations using a variety of adjustable mounts. The output signals from the image detector 601 are communicated via a suitable signal cable 620 or other suitable image conveying conduit.

The image information from camera 601 is communicated to a computer which serves as the central control processor. The image information is utilized with supporting image analysis computer software which allows items of the machinery to be recognized and used to verify proper operating conditions. Such image analysis software is commercially available from several sources. The software is customized to recognize specific features such as the lever arm end extensions 522, so that verification can be had that the lever arms are retracted upwardly and are not positioned downwardly such that installation of a batch of wafers would cause interference and breakage of the wafers as the batch is attempted to be installed within the rotor 310. Other verifications can also be performed using the image detection subsystem, such as explained below.

FIG. 8 shows the preferred second embodiment rotor 310 in side elevational detail. The front and back rotor parts 321 and 330 are joined by several longitudinal rotor frame members 340 which are spaced about the rotor at suitable radial positions. This provides an annular rotor frame or framework 320.

The front part 321 of the rotor frame is provided with a receiving opening 323. The receiving opening allows a batch of wafers to be installed within the rotor. In the preferred version shown the wafers 180 are not supported upon any carrier or other array supporting piece or pieces which stay in the processing chamber. Instead the wafer batch array is installed into the processing chamber in an array formation defined by the transfer implement, and then transferred to a receiver which is on the rotor.

The receiver is generally referred to by the reference number 363. The receiver advantageously includes a receiving space or cavity 343 adjacent the receiving opening 323. In the preferred construction shown, the receiving cavity is substantially encompassed along the sides and rear end within the rotor frame 320. The rotor frame is left with numerous open spaces to allow fluid access to the batch array of wafers when held in the receiver.

The receiver assembly also preferably includes one or more receiver array supports 350. As shown, array supports 350 are provided in the form of combs having receiving grooves and intervening ridges or projections. The edges of wafers are captured in the receiving S grooves and spacing between adjacent wafers is maintained by the intervening projections. The receiver 363 includes four stationary supports 350 each being fitted with the support combs which directly contact the edges of the wafers.

Figure 10:
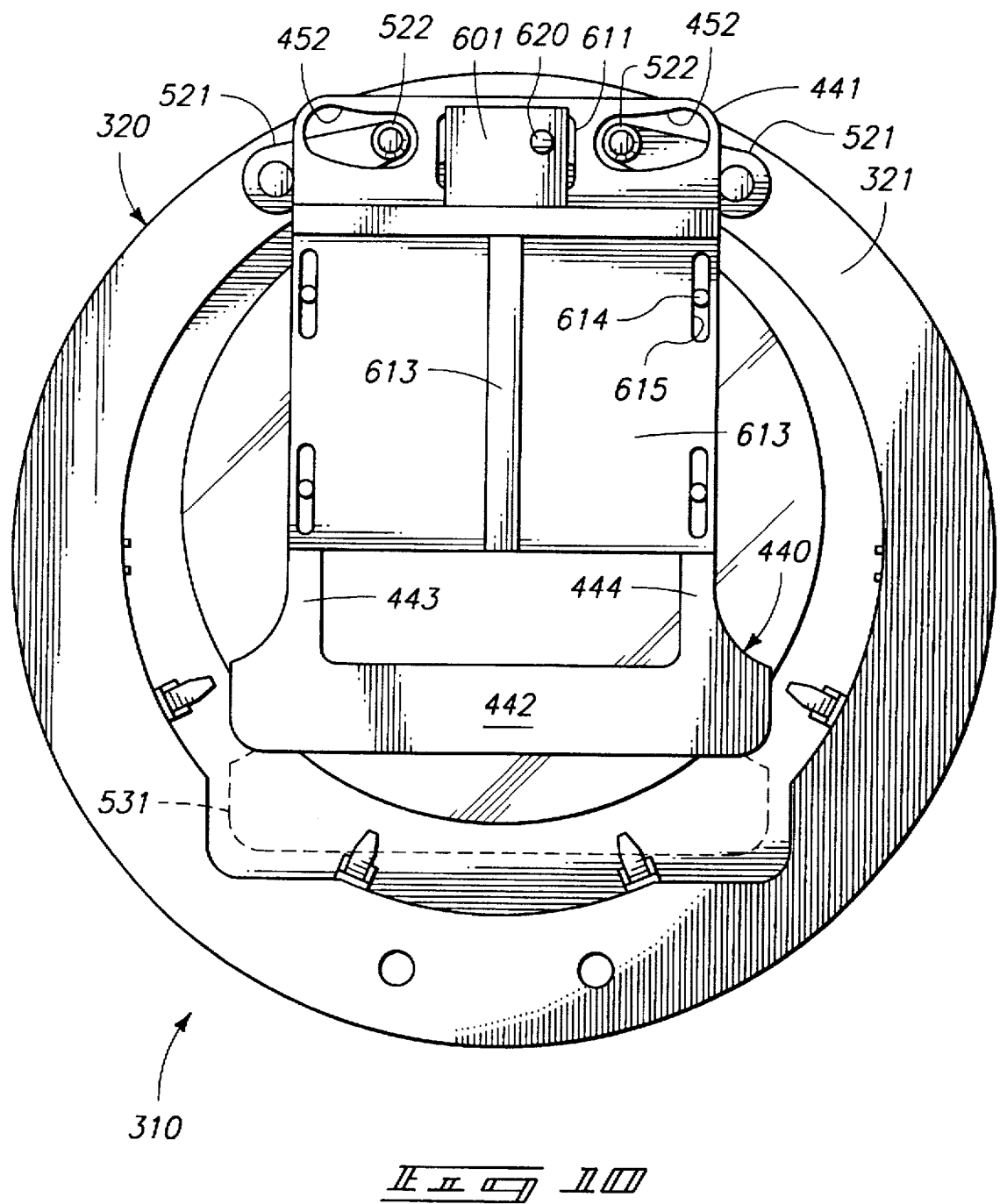
FIG. 10 is a front elevational view similar to FIG. 9 with a transfer implement positioned in front of the rotor.

The front piece 321 of the rotor frame includes the receiver opening 323. The receiver opening is preferably provided with cutouts 563 which allow sufficient clearance for the transfer implement to move downwardly and transfer the edges of the wafers into supporting contact with the supports 350. Sufficient clearance is also provided to allow the transfer implement to move downwardly to allow free travel clearance between the transfer implement supports on arms 460 and the adjacent portions of the wafers resting in the receiver supports 350. This downward transfer and clearance is illustrated in FIG. 10.

The rotor assembly 310 further includes a complementary pair of retainer assemblies 380. The retainers 380 each include a longitudinal main retainer member 390 which is mounted for pivotal action by front and back retainer end pieces 384 and 385. The front and back end pieces extend through apertures formed in the adjacent rotor frame pieces 321 and 330, respectively. Bushings or other suitable bearings 386 are provided to improve pivotal support. The front end pieces 384 are connected to the lever arms 521. Lever arms 521 and end extensions 522 serve as part of the retainer operators used to operate the retainers between open and closed positions.

The rear end pieces 385 are connected to a rear lever arm 596. The rear lever arm has a ball (not shown) mounted at the distal end thereof. The ball engages with either or two detents (not shown) formed along the rear face of the rear rotor part 330. This construction provides a restraint which maintains the retainers in either open or closed positions.

The retainers 380 also preferably include contacting bars which have undulating groove and projection faces similar to the stationary receiver members 350. Biasing springs are not shown similar to spring 102, but could be utilized to add additional biasing forces to the retainers into the open, closed or both positions.

The retainers 380 are preferably constructed so as provide automatic centrifugal motivation which urges the retainers into a closed position to engage and securely hold wafers or other articles being processed. This is preferably done by providing appropriate balance to the main retainer member 390 relative to the pivotal mounts at each end. When the rotor rotates the center of gravity of the retainer assemblies causes the retainer support members to pivot into a closed position wherein the support members are extending inward in a nearly radial orientation toward the rotational axis. It is even further preferred that the centrifugal forces and balance of the assemblies be designed to pivot the retainers slightly past a radial line in order to more securely hold the retainers in a closed position and keep it affirmatively in that position using the detent construction and mechanical engagement between the retainers and the wafers or other articles being retained in the rotor.

Operation and Methods

The invention further includes novel methods for centrifugally processing batches of semiconductor articles, such as the illustrated wafers 180. The novel methods can according to one aspect of this invention involve supporting plural semiconductor articles in a batch array upon a suitable transfer implement, such as the transfer implements 140 and 440 described herein. The batch of articles typically are relatively thin wafer shaped articles which can be circular disks or panels having other possible shapes. The supporting advantageously involves arranging the articles in a spaced parallel relationship to form the batch processing array. The articles are preferably spaced approximately equal amounts, although irregular spacings may bear some advantage in particular circumstances. The articles can be supported upon peripheral edges thereof to form the array. The supporting step is preferably done by inserting the peripheral edges of the articles within grooves or receptacles formed along supporting surfaces of the transfer implement, such as at grooves 163 or 463. The supporting can also be defined to include abutting the marginal portions of the wafers or other articles against the intervening projections formed between the grooves to provide endwise support against displacement in the longitudinal directions.

The novel methods can in another aspect of the invention include moving the transfer implement and supported batch array to and into a processing station, such as processing stations 19, which are adapted to receive and support the batch array which is formed without a carrier which remains in with the wafers throughout centrifugal processing. The moving step or steps include moving the batch array on the implement to the processing station and aligning the batch array with a processing vessel main opening, such as opening 203 (FIG. 1). The aligning operation occurs by positioning and orienting the array on the implement so as to be approximately aligned with the receiver formed on the rotor, such as receiver 463 on rotor 310.

The moving step can additionally be defined by inserting the batch array of articles through the main opening of the processing vessel. Such inserting step can be accomplished by positioning the transfer implement and supported batch array within the receiver, such as receiver 463.

In order to minimize potential damage to the wafer or other articles held in the batch array, it is preferable to include a retainer open positioning step which causes positioning of the movable article retainers, such as retainers 81 and 829 into retracted or open positions In the retracted open positions the retainers are laterally withdrawn away from the receiver opening to allow clear access for insertion of the batch array and supporting transfer implement in through the receiver opening and into longitudinally aligned or appropriate stopping position within the receiver. The opening or positioning of the retainers is advantageously accomplished at the end of the prior cycle of processing when the transfer implement is moved upwardly, thus engaging the retainer actuators in the form of receptacles 152 with the ends of the retainers to effect a lifting operation of the retainers. This lifting causes the retainers to be actuated and repositioned into the open positions.

During the loading of the receiver, the methods further preferably include the step of engaging the batch array with the receiver to support the plural semiconductor articles using the receiver in a batch array upon the supporting features of the receiver. This is advantageously accomplished by lowering the transfer implement as indicated in FIG. 10 in phantom lines 531. The step of lowering or otherwise displacing the transfer implement and supported wafers laterally with respect to the longitudinal axis of the array and axis of rotation, causes a transferring to occur. This transferring results in transfer of the wafers from the transfer implement onto supporting surfaces and features of the batch receiver. This transferring is preferably done in a manner which involves longitudinally aligning corresponding grooves which are on the transfer implement with receiving grooves in the article receiver. This results in the individual semiconductor articles being supported in a manner the same or substantially similar to the supporting step described above in connection with supporting the articles in a batch array on the transfer implement, as explained above.

In another aspect the novel methods preferably include repositioning or otherwise moving at least one movable article retainer into a closed position. This effects a retainer closing operation. In such closing operation and associated closed position, the article retainer or retainers are in juxtaposition with the plural semiconductor articles held in the receiver. More preferably, the article retainers are in direct physical con tact with the semiconductor articles, such as along peripheral edge surface s thereof. T he article retainer or retainers are repositioned in a retainer close positioning step. This retainer close positioning step is performed using the preferred embodiments shown, as a simultaneous operation or actuation associated with the engaging step described above, although simultaneous actuation may not be needed in some forms of the invention. This closing is effected in a manner which is the complement of the retainer opening operation or open positioning step described above.

The methods further include retracting or withdrawing the transfer implement from the processing chamber. This is advantageously done using the robotic transfer 15 and moving the transfer implement outwardly along a line of travel which is in the same approximate orientation as the travel into the processing chamber.

In the close positioning step the transfer implement moves downwardly or otherwise in a laterally displacing mode of action. This causes force to be transferred between the transfer implement retainer actuator openings, such as openings 152 and 452, against the exposed ends or the retainer mechanisms (100 and 522), bringing about movement of the retainers 81, 82 and 381, 382 into the closed positions. In these closed positions the contacting surfaces of the retainers may either be slightly spaced or brought in direct physical engagement with the articles being processed so as to effect an initial or preliminary urging or biasing which involves forcing of the semiconductor articles. This preliminary forcing or urging helps to seat the articles within the receiver grooves and minimizes the chance of vibration or movement of the articles, particularly as the rotor increases in angular speed. Such movement can be problematic in some processing operations, and is more generally undesirable.

In other aspects of the invention, the methods further include closing the processing chamber opening using a movable processing chamber door to provide a substantially enclosed processing chamber. In the embodiment shown in FIG. 1 this is accomplished by moving the processing chamber door 202 upwardly and across the opening 203. Other configurations are alternatively possible.

The methods further include rotating the rotor and supported wafers or other semiconductor articles. The rotating step is preferably performed to provide better access to processing fluids supplied to the processing chamber. The supply of processing fluids can occur in the form of liquids sprayed into the processing chamber, or gases which are emitted into the processing chamber. The rotating action is further useful without fluid application to spin liquids from the surfaces of the articles being processed, and to aid in drying liquids from the exposed surfaces of the wafers. The centrifugal action provides improved gaseous contact to aid in drying or other gaseous processing phases.

The novel methods further include maintaining or biasing the articles into their desired processing positions during centrifugal processing. This is advantageously accomplished by providing automatic centrifugal biasing action using the article retainer operators. The article retainer operators respond to centrifugal forces developed during rotation of the rotor. The retainer operators preferably have a restraining means, such as the biasing spring member 102 or the detent restraint which help to lock the restraints into the closed position during rotation. The restraining action can also be accentuated by designing the balancing of the retainer operators such that the contacting surfaces of the retainers go past a radial orientation which is pointing directly at the central axis of rotation and positions the retainer operators beyond this point to produce an action which maintains the retainers in a fully closed position until they are affirmatively released by the retainer actuator provided in the form of the transfer implement and its opening operation described above.

The methods can also further include opening the processing chamber opening by retracting the movable processing chamber door. This is done in a manner complementary to the door closing step listed above.

The novel methods also preferably include verifying retainer positions before any insertion of the transfer implement is attempted. This helps to reduce the risk of possible damage to the machine or articles being processed. The verifying can be performed in anticipation of the unloading phase of the processing. Verifying can best be accomplished using the image sensor 601 which looks at the open processing chamber and recognizes either or both the lever arms 521 and ends 522 using image analysis software which is commercially available. If the lever arms are in a closed position, then it is appropriate for the transfer implement to proceed with insertion to progress in unloading the machine.

Verifying steps can also be used prior to unloading to verify that the retainer actuator lever arms are in the desired closed positions. Additional verifying can be performed after loading the articles into the rotor, to assure that the retainers are in closed positions before spinning the articles.

The novel methods also preferably include inserting an unloaded transfer implement into the processing chamber to unload the batch array from the rotor. The inserting step is best prefaced with a set of moving and related steps explained above in connection with the transfer implement when loaded with a batch of articles. In the case of inserting and moving the unloaded transfer implement the arms 140 and 160 are inserted in a complementary relationship avoiding the receiver supports 63 and 463. The transfer implement is brought into the receiver opening in a relatively low condition associated with insertion to load and retraction after loading the wafers onto the rotor article receiver. The steps further include longitudinally aligning or stopping the transfer implement in a desired position in anticipation of lifting and transferring the articles onto the transfer implement. The axial aligning step brings corresponding grooves of the article supports into registration.

The novel methods in another aspect include lifting or otherwise laterally displacing the transfer implement to cause an engaging of the articles supported on the receiver article supports. This effects a transferring and brings the transfer implement into a supporting action for the articles.

The lateral displacing action of the transfer implement also preferably causes a simultaneous actuation of the article retainers on the rotor. This releases the wafers or other articles and allows upward or other appropriate lateral displacement so that the wafers are brought into a retractable orientation and position for removal of the articles from the processing station.

The methods also in another aspect include retracting the transfer implement and supported batch array of articles from the processing station.

In further aspects the retracted batch array can then be prepared and controlled for repeating some or all of the above processing steps at a second or subsequent processing station as the particular requirements may be.

In compliance with the statute, the invention identified has been described in language more or less specific as to structure and methodical features. It is to be understood, however, that the invention is not limited to the specific features shown and described since the means herein disclosed comprise preferred forms of putting the invention into effect. The invention is therefore claimed in any of its forms or modifications within the proper scope of the appended claims appropriately interpreted in accordance with the Doctrine of Equivalents.

We claim:

1. A centrifugal process rotor for holding a plurality of semiconductor articles for centrifugal treatment, comprising:

a rotor frame mounted for rotation;

a receiver on the rotor frame for receiving the plurality of semiconductor articles;

at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position.

2. A centrifugal process rotor according to claim 1 wherein the at least one movable article retainer is pivotally connected to the rotor frame.

3. A centrifugal process rotor according to claim 1 wherein the at least one movable article retainer is pivotally connected to the rotor frame and configured to force the semiconductor articles into the desired processing positions when the rotor is rotated.

4. A centrifugal process rotor according to claim 1 wherein the at least one movable article retainer is pivotally connected to the rotor frame and balanced to force the semiconductor articles into the desired processing positions when the rotor is rotated and centrifugal forces are developed thereon.

5. A centrifugal process rotor according to claim 1 wherein the at least one movable article retainer is pivotally connected to the rotor frame and balanced to provide centrifugal forces urging the semiconductor articles into the desired processing positions when the rotor is rotated; said at least one movable article retainer further being spring biased when in a closed position to initially bear upon the semiconductor articles without rotation of the rotor.

6. A centrifugal process rotor according to claim 1 and further comprising at least one retainer operator which operates the at least one movable article retainer in movable relationship to the rotor frame to effect automatic operation of the at least one movable article retainer to develop force against semiconductor articles held in the receiver during rotation of the rotor.

7. A centrifugal process rotor according to claim 1 wherein there are a plurality of movable article retainers.

8. A centrifugal process rotor according to claim 1 wherein there are a plurality of movable article retainers which are pivotally connected to the rotor frame.

9. A centrifugal process rotor according to claim 1 wherein there are a plurality of movable article retainers which are pivotally connected to the rotor frame and balanced to provide centrifugal forces urging the semiconductor articles into the desired processing positions when the rotor is rotated.

10. A centrifugal process rotor according to claim 1 wherein there are a plurality of movable article retainers, and further comprising at least one retainer operator which operates the plurality of movable article retainers in movable relationship to the rotor frame to effect automatic operation of the plurality of movable article retainers to develop forces against semiconductor articles held in the receiver during rotation of the rotor.

11. A centrifugal process rotor according to claim 1 wherein said at least one movable article retainer is spring biased.

12. A centrifugal process rotor according to claim 1 wherein said at least one movable article retainer further being spring biased when in a closed position to initially bear upon the semiconductor articles without rotation of the rotor.

13. A centrifugal process rotor according to claim 1 wherein said at least one movable article retainer is spring biased into an open position.

14. A centrifugal process rotor according to claim 1 wherein said at least one movable article retainer is spring biased into a closed position.

15. A centrifugal process rotor according to claim 1 wherein said at least one movable article retainer is spring biased into open and closed positions.

16. A centrifugal process rotor according to claim 1 wherein the rotor frame encircles the receiver.

17. A rotor and rotor transfer implement combination for loading, unloading and centrifugally processing a plurality of semiconductor articles, comprising:

a) a rotor having:

a rotor frame mounted for rotation;

a receiver on the rotor frame for receiving the plurality of semiconductor articles;

at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position;

b) a transfer implement having:

plural semiconductor holding features for holding the plurality of semiconductor articles in suitable transfer positions for being received within the receiver.

18. A rotor and rotor transfer implement combination according to claim 17 wherein the transfer implement has at least one arm which extends into the rotor when the transfer implement is loading or unloading semiconductor articles relative to the rotor.

19. A rotor and rotor transfer implement combination according to claim 17 wherein the transfer implement has at least one arm which extends into the rotor when the transfer implement is loading or unloading semiconductor articles relative to the rotor; said plural semiconductor holding features being at least partially provided on said at least one arm.

20. A rotor and rotor transfer implement combination according to claim 17 wherein the transfer implement has plural arms which extend into the rotor when the transfer implement is loading or unloading semiconductor articles relative to the rotor.

21. A rotor and rotor transfer implement combination according to claim 17 wherein the transfer implement has plural arms which extend into the rotor when the transfer implement is loading or unloading semiconductor articles relative to the rotor; said plural semiconductor holding features being at least partially provided on said arms.

22. A rotor and rotor transfer implement combination according to claim 17 wherein the transfer implement further comprises at least one retainer actuator which interacts with portions of the rotor to affect the position of the at least one movable article retainer relative to the rotor frame.

23. A rotor and rotor transfer implement combination according to claim 17 wherein the at least one movable article retainer is pivotally connected to the rotor frame.

24. A rotor and rotor transfer implement combination according to claim 17 wherein the at least one movable article retainer is pivotally connected to the rotor frame and configured to force the semiconductor articles into the desired processing positions when the rotor is rotated.

25. A rotor and rotor transfer implement combination according to claim 17 wherein the at least one movable article retainer is pivotally connected to the rotor frame and balanced to force the semiconductor articles into the desired processing positions when the rotor is rotated and centrifugal forces are developed thereon.

26. A rotor and rotor transfer implement combination according to claim 17 wherein the at least one movable article retainer is pivotally connected to the rotor frame and balanced to provide centrifugal forces urging the semiconductor articles into the desired processing positions when the rotor is rotated; said at least one movable article retainer further being spring biased when in a closed position to initially bear upon the semiconductor articles without rotation of the rotor.

27. A rotor and rotor transfer implement combination according to claim 17 and further comprising at least one retainer operator which operates the at least one movable article retainer in movable relationship to the rotor frame to effect automatic operation of the at least one movable article retainer to develop force against semiconductor articles held in the receiver during rotation of the rotor.

28. A rotor and rotor transfer implement combination according to claim 17 wherein there are a plurality of movable article retainers.

29. A rotor and rotor transfer implement combination according to claim 17 wherein there are a plurality of movable article retainers which are pivotally connected to the rotor frame.

30. A rotor and rotor transfer implement combination according to claim 17 wherein there are a plurality of movable article retainers which are pivotally connected to the rotor frame and balanced to provide centrifugal forces urging the semiconductor articles into the desired processing positions when the rotor is rotated.

31. A rotor and rotor transfer implement combination according to claim 17 wherein there are a plurality of movable article retainers, and further comprising at least one retainer operator which operates the plurality of movable article retainers in movable relationship to the rotor frame to effect automatic operation of the plurality of movable article retainers to develop forces against semiconductor articles held in the receiver during rotation of the rotor.

32. A rotor and rotor transfer implement combination according to claim 17 wherein said at least one movable article retainer is spring biased.

33. A rotor and rotor transfer implement combination according to claim 17 wherein said at least one movable article retainer further being spring biased when in a closed position to initially bear upon the semiconductor articles without rotation of the rotor.

34. A rotor and rotor transfer implement combination according to claim 17 wherein said at least one movable article retainer is spring biased into an open position.

35. A rotor and rotor transfer implement combination according to claim 17 wherein said at least one movable article retainer is spring biased into a closed position.

36. A rotor and rotor transfer implement combination according to claim 17 wherein said at least one movable article retainer is spring biased into open and closed positions.

37. A rotor and rotor transfer implement combination according to claim 17 wherein the rotor frame encircles the receiver.

38. A rotor and rotor transfer implement combination according to claim 17 and further comprising a vision subsystem including a vision detector for detecting the relative position of the rotor and rotor transfer implement.

39. A centrifugal processing system for centrifugal treatment of batches containing a plurality of semiconductor articles, comprising:
 a frame;
 a batch transfer robot which is movable relative to the frame;
 at least one processing station mounted in sufficient proximity to the batch transfer robot to allow transfer of batches to and from the at least one processing station, said at least one processing station having:
  a processing vessel which defines a processing chamber therein;
  a rotor frame mounted for controlled rotation within the processing chamber;
  a receiver on the rotor frame for receiving a batch containing a plurality of semiconductor articles;
  at least one movable article retainer connected to the rotor frame and rotatable with the rotor frame; said at least one movable article retainer being movable relative to the rotor frame and semiconductor articles held in the receiver to maintain semiconductor articles at desired processing positions on the rotor when the at least one movable article retainer is in a closed position;
 a transfer implement mounted upon the batch transfer robot having plural semiconductor holding features for holding the plurality of semiconductor articles in suitable transfer positions for being received within the receiver.

40. A rotor and rotor transfer implement combination according to claim 39 wherein the transfer implement has at least one arm which extends into the rotor when the transfer implement is loading or unloading semiconductor articles relative to the rotor.

41. A rotor and rotor transfer implement combination according to claim 39 wherein the transfer implement has at least one arm which extends into the rotor when the transfer implement is loading or unloading semiconductor articles relative to the rotor; said plural semiconductor holding features being at least partially provided on said at least one arm.

42. A rotor and rotor transfer implement combination according to claim 39 wherein the transfer implement has plural arms which extend into the rotor when the transfer implement is loading or unloading semiconductor articles relative to the rotor.

43. A rotor and rotor transfer implement combination according to claim 39 wherein the transfer implement has plural arms which extend into the rotor when the transfer implement is loading or unloading semiconductor articles relative to the rotor; said plural semiconductor holding features being at least partially provided on said arms.

44. A rotor and rotor transfer implement combination according to claim 39 wherein the transfer implement further comprises at least one retainer actuator which interacts with portions of the rotor to affect the position of the at least one movable article retainer relative to the rotor frame.

45. A rotor and rotor transfer implement combination according to claim 39 wherein the at least one movable article retainer is pivotally connected to the rotor frame.

46. A rotor and rotor transfer implement combination according to claim 39 wherein the at least one movable article retainer is pivotally connected to the rotor frame and configured to force the semiconductor articles into the desired processing positions when the rotor is rotated.

47. A rotor and rotor transfer implement combination according to claim 39 wherein the at least one movable article retainer is pivotally connected to the rotor frame and balanced to force the semiconductor articles into the desired processing positions when the rotor is rotated and centrifugal forces are developed thereon.

48. A rotor and rotor transfer implement combination according to claim 39 wherein the at least one movable article retainer is pivotally connected to the rotor frame and balanced to provide centrifugal forces urging the semiconductor articles into the desired processing positions when the rotor is rotated; said at least one movable article retainer further being spring biased when in a closed position to initially bear upon the semiconductor articles without rotation of the rotor.

49. A rotor and rotor transfer implement combination according to claim 39 and further comprising at least one retainer operator which operates the at least one movable article retainer in movable relationship to the rotor frame to effect automatic operation of the at least one movable article retainer to develop force against semiconductor articles held in the receiver during rotation of the rotor.

50. A rotor and rotor transfer implement combination according to claim 39 wherein there are a plurality of movable article retainers.

51. A rotor and rotor transfer implement combination according to claim 39 wherein there are a plurality of movable article retainers which are pivotally connected to the rotor frame.

52. A rotor and rotor transfer implement combination according to claim 39 wherein there are a plurality of movable article retainers which are pivotally connected to the rotor frame and balanced to provide centrifugal forces urging the semiconductor articles into the desired processing positions when the rotor is rotated.

53. A rotor and rotor transfer implement combination according to claim 39 wherein there are a plurality of movable article retainers, and further comprising at least one retainer operator which operates the plurality of movable article retainers in movable relationship to the rotor frame to effect automatic operation of the plurality of movable article retainers to develop forces against semiconductor articles held in the receiver during rotation of the rotor.

54. A rotor and rotor transfer implement combination according to claim 39 wherein said at least one movable article retainer is spring biased.

55. A rotor and rotor transfer implement combination according to claim 39 wherein said at least one movable article retainer further being spring biased when in a closed position to initially bear upon the semiconductor articles without rotation of the rotor.

56. A rotor and rotor transfer implement combination according to claim 39 wherein said at least one movable article retainer is spring biased into an open position.

57. A rotor and rotor transfer implement combination according to claim 39 wherein said at least one movable article retainer is spring biased into a closed position.

58. A rotor and rotor transfer implement combination according to claim 39 wherein said at least one movable article retainer is spring biased into open and closed positions.

59. A rotor and rotor transfer implement combination according to claim 39 wherein the rotor frame encircles the receiver.

60. A rotor and rotor transfer implement combination according to claim 39 and further comprising a vision subsystem including a vision detector for detecting the relative position of the rotor and rotor transfer implement.

61. A method for centrifugally processing batches of semiconductor articles, comprising:

supporting plural semiconductor articles in a batch array upon a transfer implement;

moving the transfer implement into a processing station having a process chamber opening which opens to a processing chamber defined within a processing vessel; said processing station further having a rotor which includes a rotor frame which is mounted for rotation within the process chamber;

positioning the transfer implement within a receiver which is on the rotor frame;

engaging the batch array with the receiver to support the plural semiconductor articles using the receiver;

repositioning at least one movable article retainer which is movably mounted upon the rotor frame into a closed position wherein the at least one movable article retainer is in juxtaposition with the plural semiconductor articles held in the receiver; said at least one movable article retainer serving to maintain the semiconductor articles at desired processing positions on the rotor when the at least one movable article retainer is in a closed position.

62. A method according to claim 61 and further comprising retracting the transfer implement from the processing chamber;

closing the processing chamber opening using a movable processing chamber door to provide a substantially enclosed processing chamber;

rotating the rotor and supported plural semiconductor articles within the processing chamber.

63. A method according to claim 61 and further comprising:

retracting the transfer implement from the processing chamber;

closing the processing chamber opening using a movable processing chamber door to provide a substantially enclosed processing chamber;

rotating the rotor and supported plural semiconductor articles within the processing chamber;

opening the processing chamber opening by retracting the movable processing chamber door;

moving the transfer implement into the processing station;

repositioning the at least one movable article retainer which is movably mounted upon the rotor frame into an open position wherein the at least one movable article retainer is spaced from the plural semiconductor articles held in the receiver;

engaging the transfer implement with the batch array to support the plural semiconductor articles upon the transfer implement;

retracting the transfer implement and supported batch array from the processing station.

64. A method according to claim 61 and further comprising urging the plural semiconductor articles using a centrifugally motivated article retainer operator to apply added force maintaining the plural semiconductor articles in the desired processing positions during rotation of the rotor and supported batch array.

* * * * *